US 11,282,855 B2

United States Patent
Herner et al.

(10) Patent No.: US 11,282,855 B2
(45) Date of Patent: Mar. 22, 2022

(54) METHODS FOR FORMING MULTI-LAYER VERTICAL NOR-TYPE MEMORY STRING ARRAYS

(71) Applicant: SUNRISE MEMORY CORPORATION, San Jose, CA (US)

(72) Inventors: Scott Brad Herner, Lafayette, CO (US); Wu-Yi Henry Chien, San Jose, CA (US); Jie Zhou, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 97 days.

(21) Appl. No.: 16/707,920

(22) Filed: Dec. 9, 2019

(65) Prior Publication Data
US 2020/0185411 A1    Jun. 11, 2020

Related U.S. Application Data

(60) Provisional application No. 62/777,000, filed on Dec. 7, 2018.

(51) Int. Cl.
*H01L 27/11582* (2017.01)
*H01L 21/311* (2006.01)
*H01L 21/3213* (2006.01)

(52) U.S. Cl.
CPC .. *H01L 27/11582* (2013.01); *H01L 21/31144* (2013.01); *H01L 21/32139* (2013.01); *H01L 21/31116* (2013.01)

(58) Field of Classification Search
CPC ......... H01L 27/11582; H01L 21/31144; H01L 21/32139; H01L 21/31116
See application file for complete search history.

(56) References Cited

U.S. PATENT DOCUMENTS

| | | | |
|---|---|---|---|
| 8,604,618 B2 | 12/2013 | Cooney et al. | |
| 9,299,580 B2 | 3/2016 | Kong et al. | |
| 9,455,268 B2 | 9/2016 | Oh et al. | |
| 10,651,196 B1* | 5/2020 | Sharangpani | ..... H01L 21/76876 |
| 2007/0012987 A1 | 1/2007 | McTeer | |
| 2010/0327413 A1* | 12/2010 | Lee | ................... H01L 21/31144 257/618 |
| 2012/0208347 A1 | 8/2012 | Hwang et al. | |
| 2016/0358934 A1* | 12/2016 | Lin | ................... H01L 21/32115 |
| 2017/0194341 A1* | 7/2017 | Yamada | ............ H01L 27/11582 |
| 2017/0213731 A1* | 7/2017 | Yoon | ................. H01L 21/02118 |

OTHER PUBLICATIONS

"Invitation to Pay Additional Fees, PCT/US2019/065256", dated Feb. 13, 2020, 2 pages.
"PCT Search Report and Written Opinion, PCT/US2019/065256", dated Apr. 14, 2020.

* cited by examiner

*Primary Examiner* — Christine A Enad
(74) *Attorney, Agent, or Firm* — Edward C. Kwok; VLP Law Group, LLP

(57) ABSTRACT

A method for forming 3-dimensional vertical NOR-type memory string arrays uses damascene local bit lines is provided. The method of the present invention also avoids ribboning by etching local word lines in two steps. By etching the local word lines in two steps, the aspect ratio in the patterning and etching of stack of local word lines ("word line stacks") is reduced, which improves the structural stability of the word line stacks.

19 Claims, 29 Drawing Sheets

METHODS FOR FORMING MULTI-LAYER VERTICAL NOR-TYPE MEMORY STRING ARRAYS

CROSS REFERENCE TO RELATED APPLICATIONS

The present application is related to and claims priority of U.S. provisional application ("Provisional Application"), Ser. No. 62/777,000, entitled "Methods for Forming Multi-layer Vertical NOR-type Memory String Arrays," filed Dec. 7, 2018.

The present application relates to U.S. patent application ("Non-Provisional Application I"), Ser. No. 16/107,732, "entitled "Three-dimensional vertical NOR Flash Thin film Transistor Strings," Aug. 21, 2018, which is a continuation application of U.S. patent application, Ser. No. 15/837,734, entitled "Three-dimensional vertical NOR Flash Thin film Transistor Strings," filed on Dec. 11, 2017, which is a divisional application of U.S. patent application, Ser. No. 15/343,332, entitled "Three-dimensional vertical NOR Flash Thin film Transistor Strings," filed on Nov. 4, 2016, which is related to and claims priority of (i) U.S. provisional patent application, Ser. No. 62/260,137, entitled "Three-dimensional Vertical NOR Flash Thin-film Transistor Strings," filed on Nov. 25, 2015.

The present application is also related to U.S. provisional patent application ("Provisional Application II"), Ser. No. 62/625,818, entitled "Three-dimensional Vertical NOR Flash Thin-film Transistor Strings," filed on Feb. 2, 2018; (ii) U.S. patent application ("Provisional Application III"), Ser. No. 62/630,214, entitled "Three-dimensional Vertical NOR Flash Thin-film Transistor Strings," filed on Feb. 13, 2018; and (iii) U.S. provisional patent application ("Provisional Application IV"), Ser. No. 62/771,922, entitled "Staircase Structures for Electrically Connecting Multiple Horizontal Conductive Layers of a 3-Dimensional Memory Device," filed on Nov. 27, 2018.

The disclosures of Non-Provisional Application and Provisional Applications I, II, III and IV are hereby incorporated by reference in their entireties.

BACKGROUND OF THE INVENTION

1. Field of the Invention

The present invention is related to 3-dimensional memory structures. In particular, the present invention is related to 3-dimensional memory structures organized in arrays of vertical NOR-type memory strings.

2. Discussion of the Related Art

Methods for forming multi-layer Vertical NOR-type memory string arrays have been described previously; for example, various variations of forming such memory arrays are disclosed in Non-Provisional Application and Provisional Applications II and III incorporated by reference above.

SUMMARY

According to one embodiment of the present invention, a method for forming 3-dimensional vertical NOR-type memory string arrays uses damascene local vertical bit lines is provided. The method of the present invention also avoids ribboning by etching local word lines in two steps. By etching the local word lines in two steps, the aspect ratio in the patterning and etching of stacks of local word lines ("word line stacks") is reduced, which improves the structural stability of the word line stacks. The present invention also addresses alignment issues incidental to etching the word line strips in two steps.

The present invention is better understood upon consideration of the detailed description below in conjunction with the accompanying drawings.

BRIEF DESCRIPTION OF THE DRAWINGS

To facilitate both cross-referencing among the figures and simplification of the detailed description, like elements in the figures are assigned like reference numerals.

DETAILED DESCRIPTION OF THE PREFERRED EMBODIMENT

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

Figure 1:
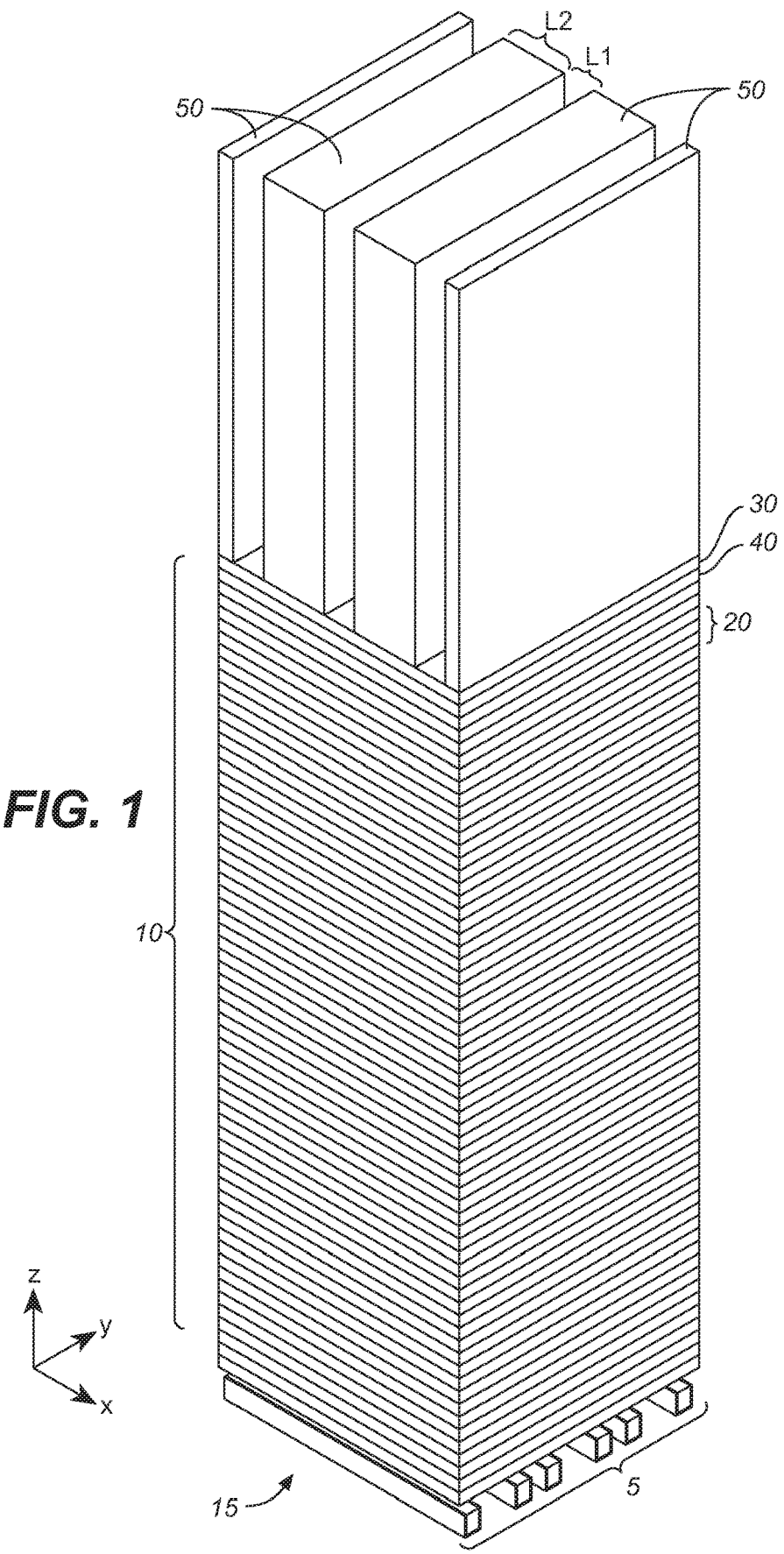
FIG. 1 shows memory structure 10 provided on and isolated from a conductive layer ("global interconnect lines") 5, which includes numerous conductors, each extending along a first direction (X-direction).

FIG. 1 shows memory structure 10 provided on and isolated from a conductive layer ("global interconnect lines") 5 on planar surface 15 of a semiconductor substrate. The normal to planar surface 15 is along a first direction (Z-direction). The conductors in global interconnect lines 5 include numerous conductors, each extending along a second direction (X-direction) orthogonal to the Z-direction. The conductors in conductive layer 5 are each separated and insulated from its neighboring conductors along a third direction (Y-direction, substantially orthogonal to both the X-direction and the Z-direction). Global interconnect lines 5 provide electrical connectivity between vertical local word lines yet to be formed, and control, decode, voltage sources and sense circuits formed in the semiconductor substrate (not shown). Such connectivity can be either directly, or through select transistors (not shown).

Global interconnect lines 5 may include any suitable conductive material such as tungsten (W), titanium nitride (TiN), titanium (Ti), tantalum (Ta), chrome (Cr), molybdenum (Mo), cobalt (Co), or any combination of these materials. As shown in FIG. 1, memory structure 10 includes 32 multi-layers (e.g., multi-layer 20), each of which may include, for example, silicon nitride (SiN) layer 30 and silicon oxide ($SiO_2$) layer 40. Alternatively, layer 30 may include, for example, a p-doped or n-doped silicon or silicon germanium, rather than silicon nitride. Each of the layers in each multi-layer may be deposited using any suitable technique, e.g., low pressure chemical vapor deposition (LPCVD), plasma enhanced chemical vapor deposition (PECVD), atomic layer deposition (ALD, itself a form of CVD), sputtering, or evaporation, most preferably by PECVD. Although FIG. 1 shows 32 multi-layers, the number of multi-layers in memory structure 10 can be any suitable number (e.g., one, two, sixteen, sixty-four, or more). After depositing memory structure 10, a masking layer (e.g., a carbon-based masking layer) is deposited and patterned to form masking structures 50 using a photoresist layer (not shown) Masking structures 50 each have width $L_2$ and each separating from its neighboring masking structures by trenches of width $L_1$, with width $L_2$ preferably not less than twice desired width $L_1$. Width $L_1$ defines the desired width of the trenches between the active strips to be formed.

Figure 2:
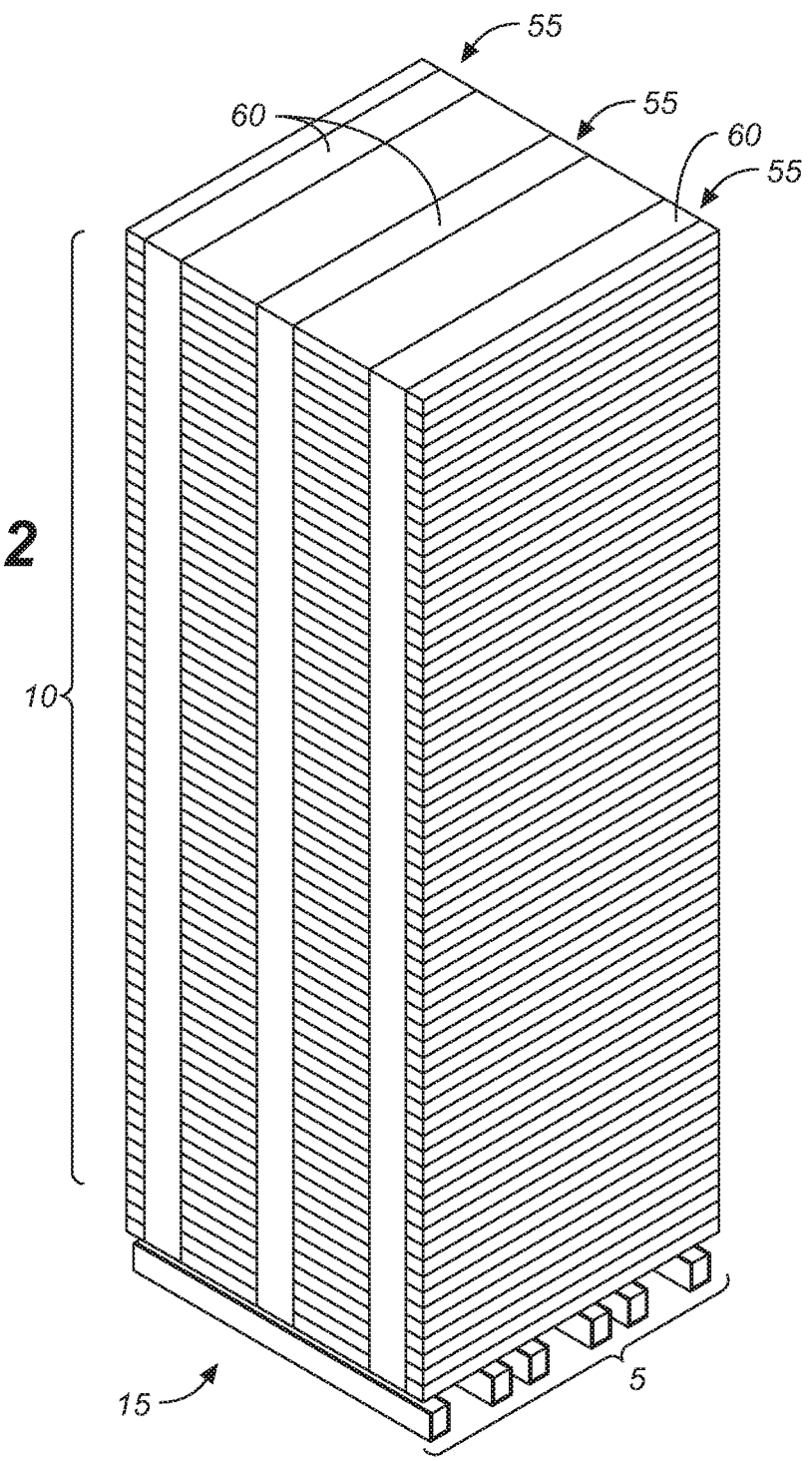
FIG. 2 shows sacrificial dielectric layer 60 filling trenches 55, with excess dielectric material deposited on the top of memory structure 10 removed.

A first set of trenches 55 are then created by etching through the multi-layers of memory structure 10 using masking structures 50, followed by removal of masking structures 50. FIG. 2 shows sacrificial dielectric layer 60 filling trenches 55, with excess dielectric material deposited on the top of memory structure 10 removed. Removal of sacrificial dielectric layer 60 from the top of memory structure 10 may be accomplished using any suitable technique, such as chemical-mechanical polishing (CMP) or etchback, most preferably CMP. Sacrificial dielectric layer 60 may include any suitable material (e.g., $SiO_2$, porous $SiO_2$, boron doped $SiO_2$ (BSG), phosphorus doped $SiO_2$ (PSG), boron phosphorus doped $SiO_2$ (BPSG), SiOH, SiCOH, any combination of these materials, or any suitable material). Most preferably, sacrificial dielectric layer 60 is formed out of a material that can be etched much faster than SiN layer 30 and $SiO_2$ layer 40.

Figure 3:
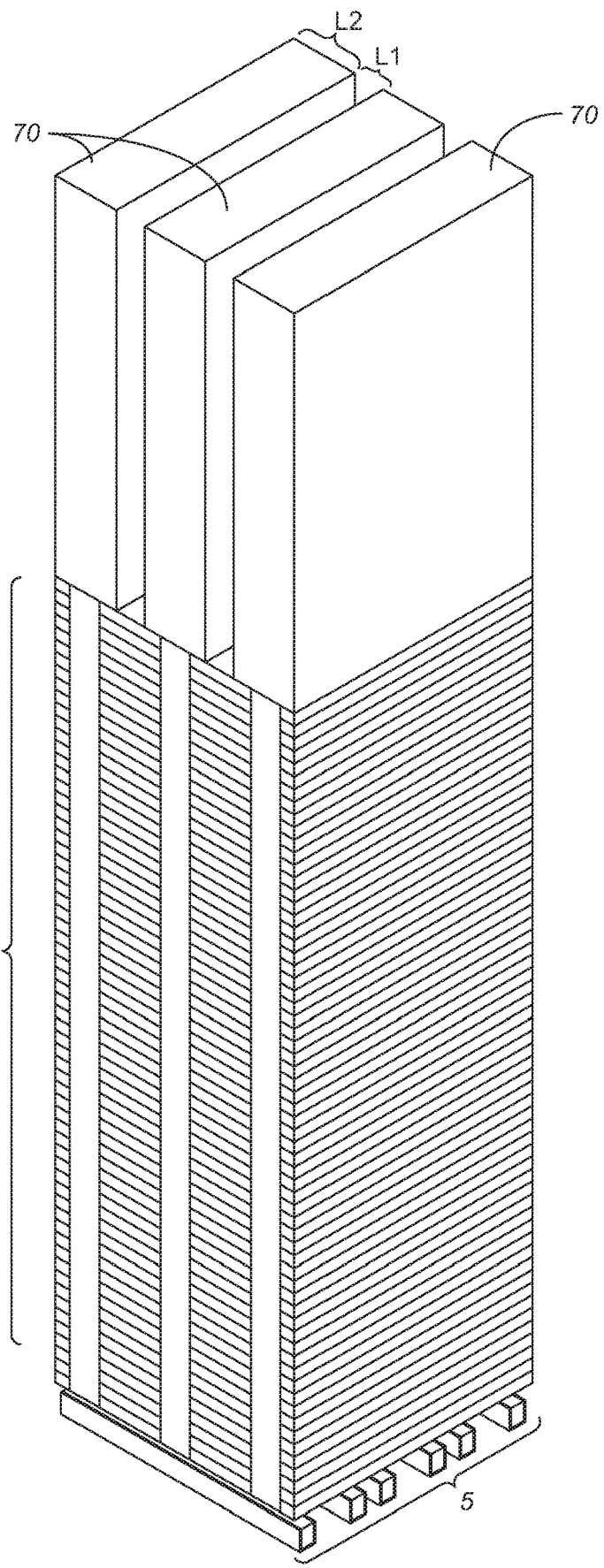
FIG. 3 shows another masking layer deposited on memory structure 10 and patterned to form masking structures 70.
Figure 4:
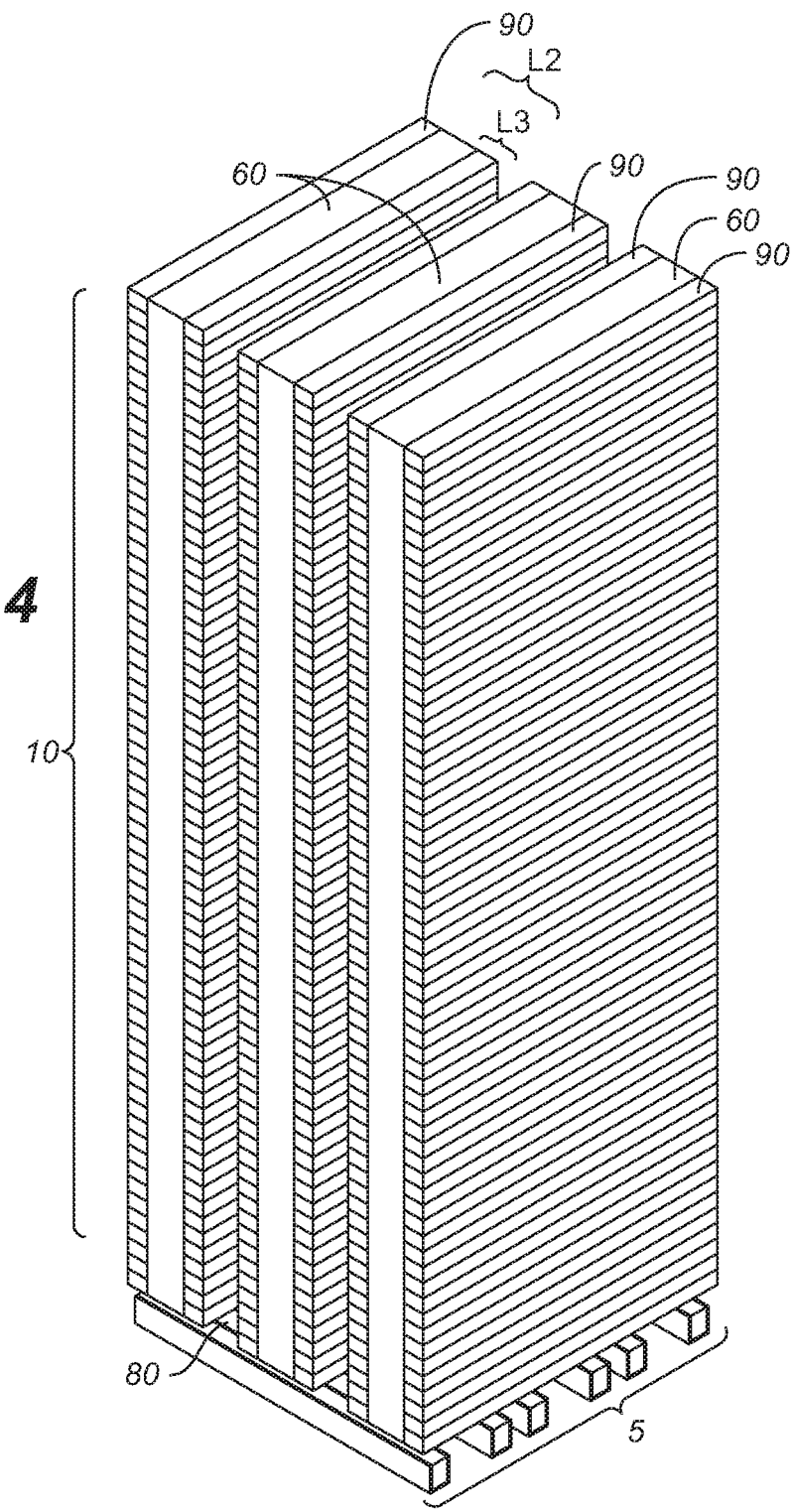
FIG. 4 shows second set of trenches 80 fromed by etching through the multi-layers of memory structure 100, forming multi-layer stacks 90.

Thereafter, another masking layer is deposited on memory structure 10 and patterned to form masking structures 70, as shown in FIG. 3. Masking structures 70, each of which extends over sacrificial dielectric layer 60 in one of trenches 50 and portions of the multilayers on both sides of that trench, are separated from each other by width $L_1$ (as in masking structures 50) to define second set of trenches 80 that are parallel to first set of trenches 55. FIG. 4 shows second set of trenches 80 fromed by etching through the multi-layers of memory structure 10, thus forming narrow multi-layer stacks ("word line stacks") 90 each extending along the Y-direction. Each multi-layer in each word line stack forms a "word line strip.". Word line stacks 90 each have width $L_3$ that is much less than width $L_2$ of masking structures 50 and 70. By using a relative large $L_2$ value in masking structures 50 and 70, a problem known as "ribboning" is avoided.

Figure 17A:
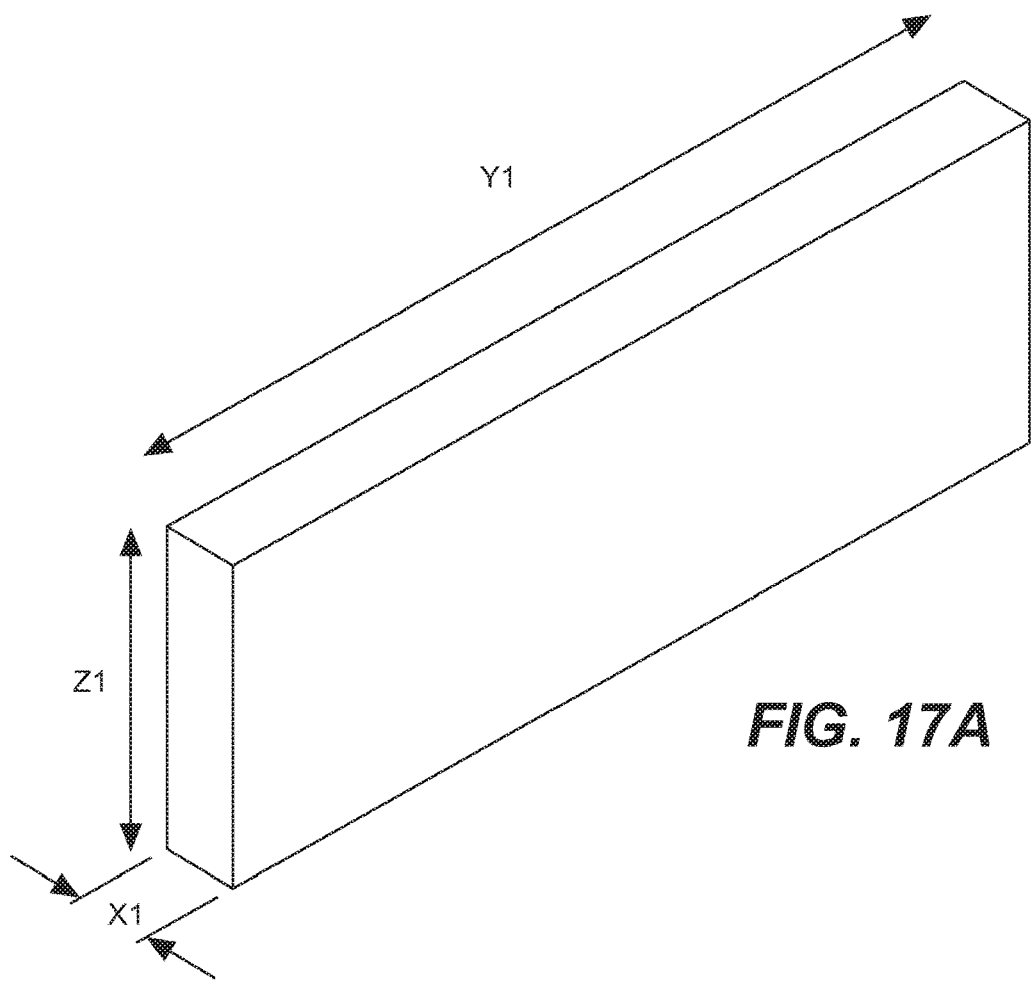
FIGS. 17A and 17B illustrate the phenomenon of ribboning, which is a stress-induced deformation of a microscopic rectangular feature.
Figure 17B:
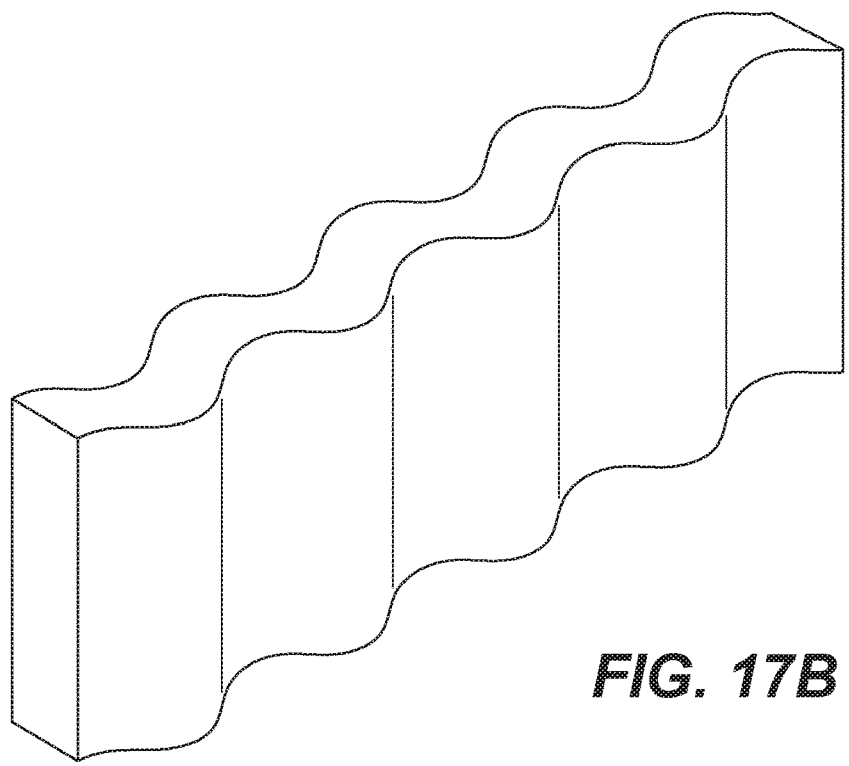

(FIGS. 17A and 17B illustrate the phenomenon of ribboning, which is a stress-induced deformation of a microscopic rectangular feature. FIG. 17A shows a microscopic rectangular feature (e.g., a feature formed out of developing a masking material) with intended dimensions width X1, length Y1 and height Z1. In some manufacturing processes, when the aspect ratio Z1/X1 exceeds 10, the stress in the rectangular feature may lead to deformation along length Y1, such that the resulting feature "ribbons" from an intended straight line to become a series of connected S-curves, such as shown in FIG. 17B. Ribboning is more acute with smaller widths, especially when width X1 is scaled below approximately 45 nm.)

In practice, due to limitations of existing lithography tools, some misalignment may occur, so that the overlaps of each masking structure 70 over the left and right stacks underneath it are not exactly equal. For example, if the target width $L_3$ is 50 nanometers and the worst-case misalignment is ±5 nanometers, then the left-side overlap may be as much as 55 nanometers wide, while the right-side overlap may be as narrow as 45 nanometer wide. This manufacturing variability in width causes into variability of the width of the yet to be formed even and odd metallic conductor word lines. In turn, the variability in width may cause higher electrical resistance of the narrower word lines. Such variability can be absorbed within the chip design, for example by treating the left and right side thin-film transistors of each stack as belonging to two separate groups, with each group being provided with its dedicated reference transistors or reference memory strings that are constituted from within their respective groups.

Figure 5:
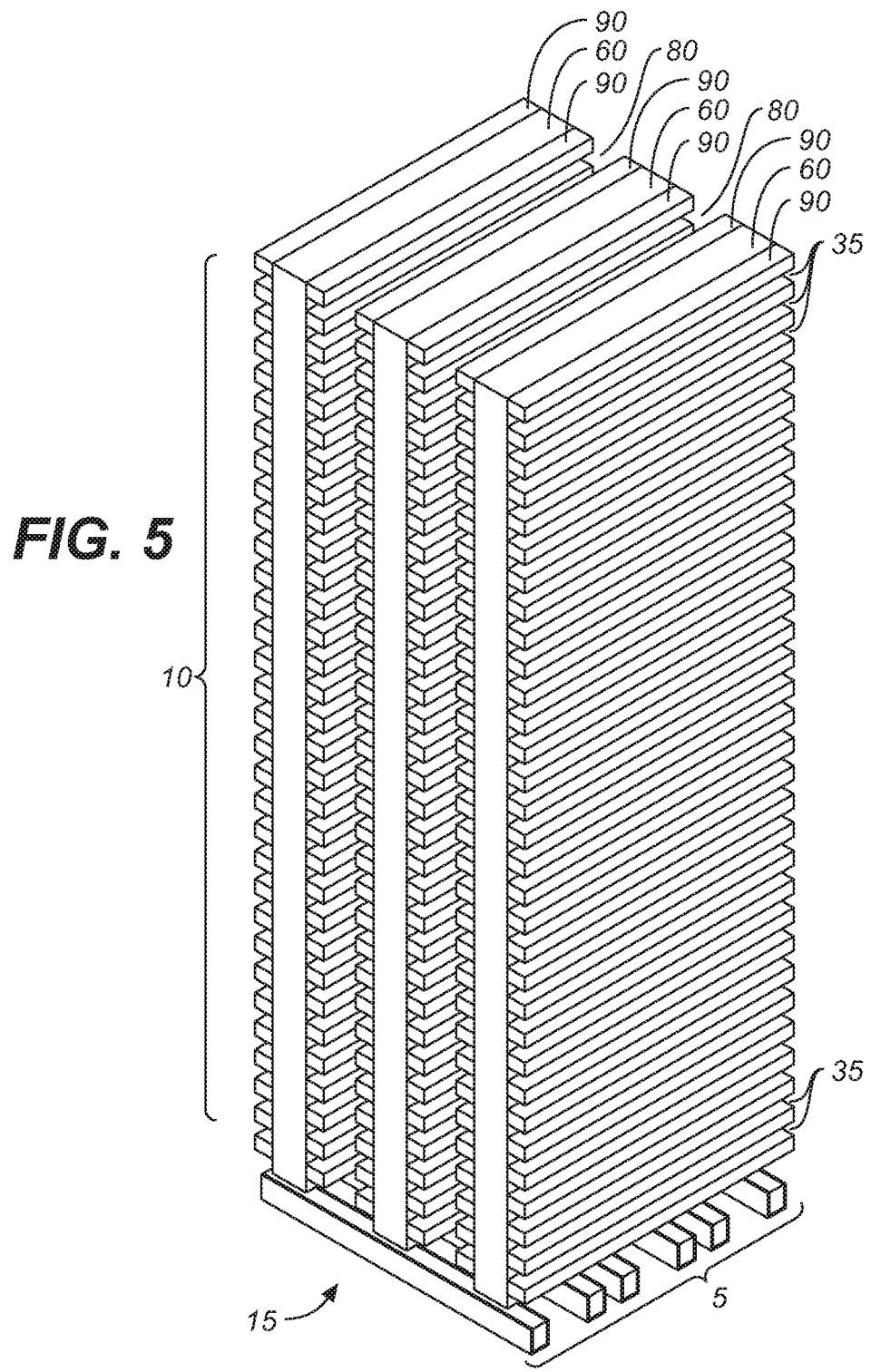
FIG. 5 shows memory structure 10 with cavities 35 after removal of SiN layer 30 in each multi-layer by a selective etch.

Next, as shown in FIG. 5, SiN layer 30 of each word line strip in memory structure 10 are removed by a selective etch. SiN layer 30 may be removed using any suitable technique, such as a corrosive gas or a wet chemical acid or base. For example, SiN layer 30 may be removed by wet etching in phosphoric acid heated to 180° C. Etching stops when each SiN layer 30 is etched all the way to sacrificial dielectric layer 60 in trenches 55. As sacrificial dielectric layer 60 in trenches 55 are not materially etched, their support allows word line stacks 90 to maintain their intended structural forms (i.e., each narrow, long and tall along the entire length), even though the constituent SiN layer 30 in each word line strip is removed, thereby creating cavities or discontinuities 35 in word line stacks 90. Note that braces spanning between adjacent stacks 90 and placed at suitable intervals may not be needed to support the narrow active stacks under existing state-of-the-art technology. However, such braces may be required in the future for highly scaled 3-dimensional memory arrays when width $L_3$ becomes even narrower, or when the word line stacks are exceedingly tall (e.g., the number of word line strips is exceedingly large), so that it becomes prudent to support the very long word line stacks at suitable intervals.

Figure 6:
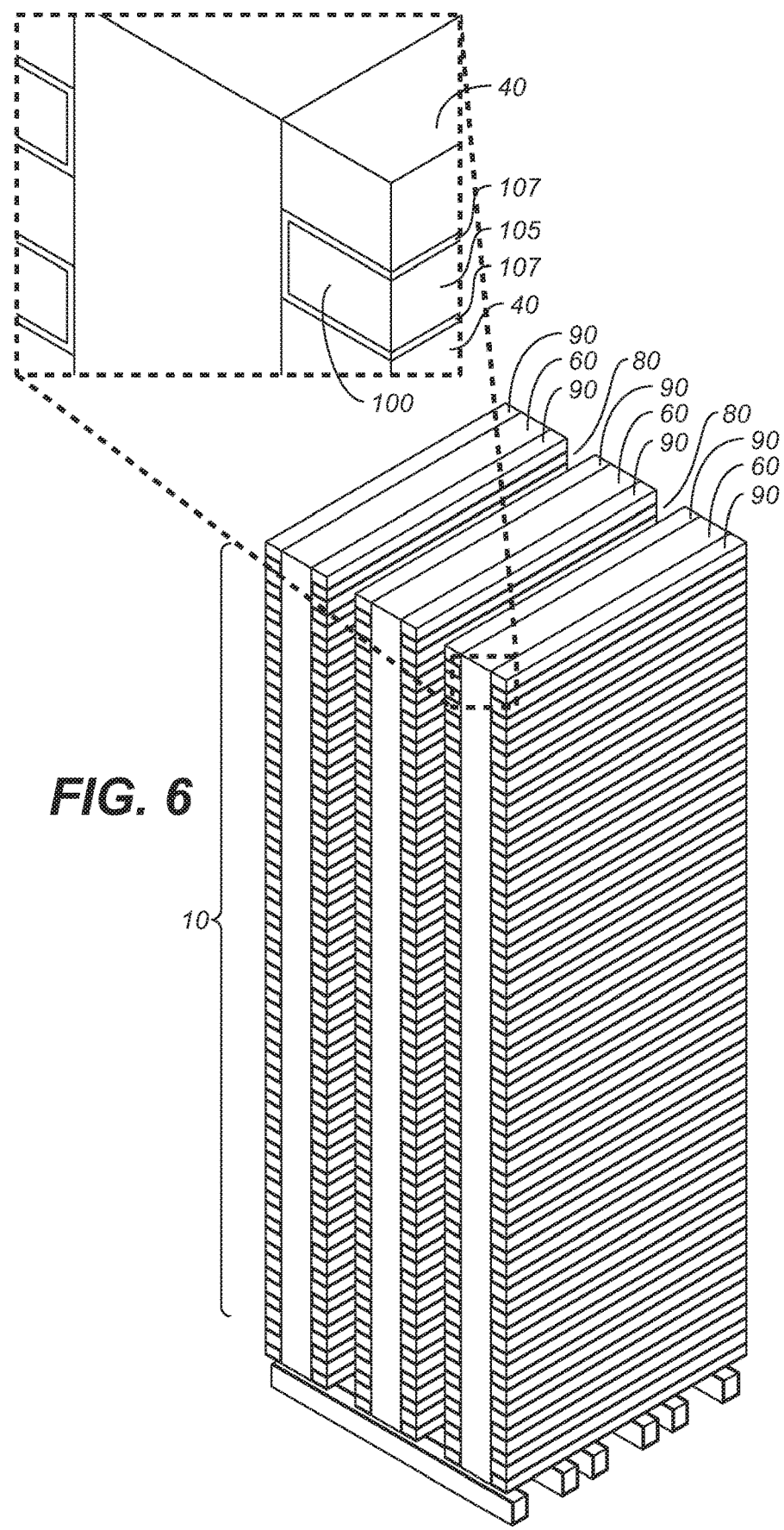
FIG. 6 shows metal layer 100 filling cavities 35 of the word line strips of memory structure 10.
Figure 7:
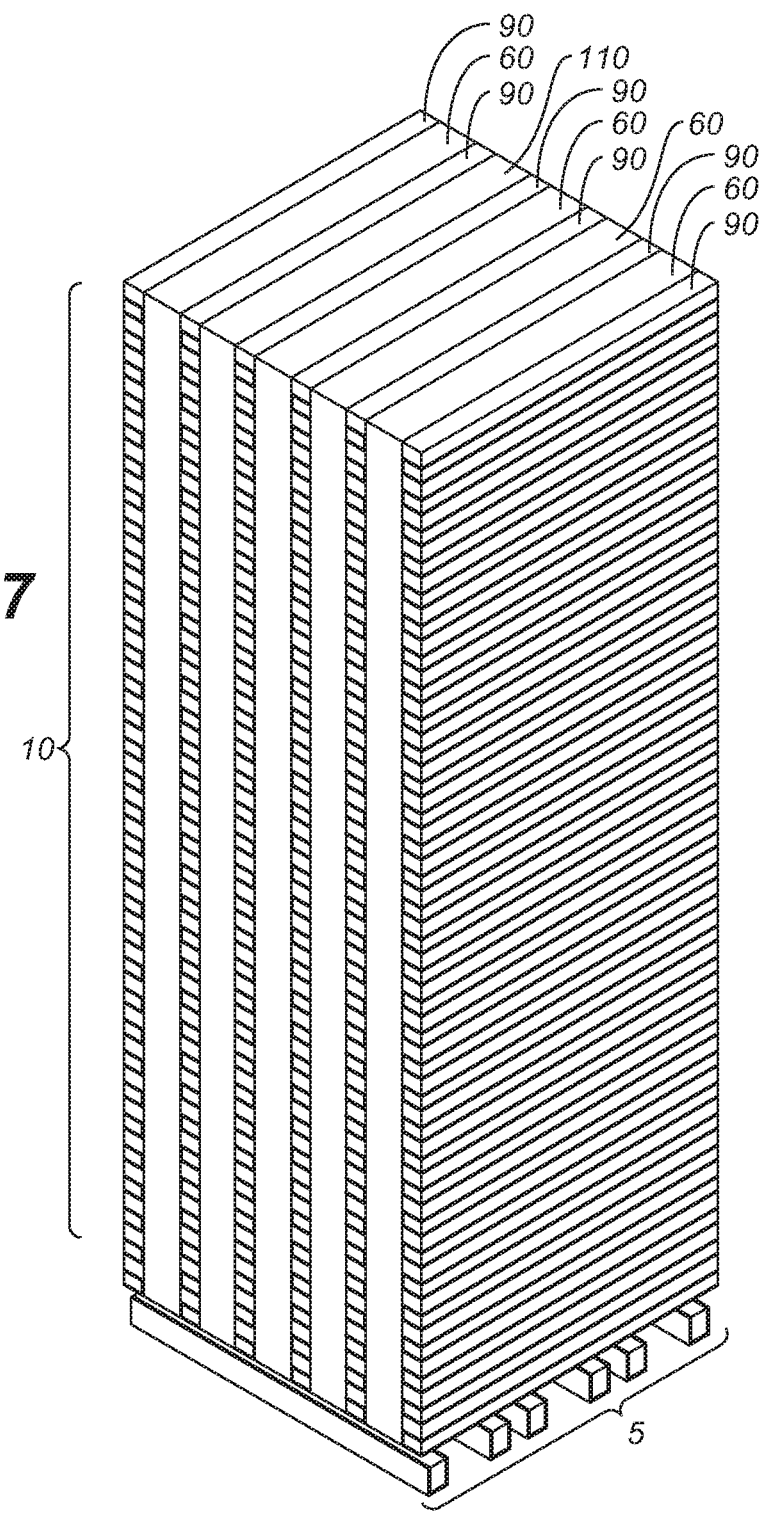
FIG. 7 shows sacrificial dielectric layer 110 in trenches 80, after excess sacrificial dielectric material is removed from the top surfaces of memory structure 10 by any suitable planarization technique, such as CMP.

One or more metal layers are then provided to form metal layer 100, which fills cavities 35 in each word line strip. Metal layer 100 is then removed from the sidewalls of trenches 80 by a suitable etch, leaving metal layer 100 only in the word line strips, as shown in FIG. 6. In some embodiments, metal layer 100 is further recessed by selectively etching up to approximately 6 nanometers away from the sidewalls of trenches 80, so as to accommodate an oxide cap layer or silicon barrier cap layer to be placed therein, as is known by those of ordinary skill in the art. The oxide cap layer or silicon barrier cap layer separates metal layer 100 from directly contacting a charge trapping layer yet to be formed. Metal layer 100 may be any suitable material, such as TiN, TaN, Ta, W, Mo, or any combination of these metals, deposited by any suitable technique, such as ALD, CVD, PVD, sputtering, evaporation, or any suitable combination of these techniques, most preferably ALD for a liner metal like TiN and CVD for a filler material such as W or Mo. As shown in FIG. 7, a combination of tungsten layer 105 between thinner TiN layer 107 form metal layer 100.

Figure 8:
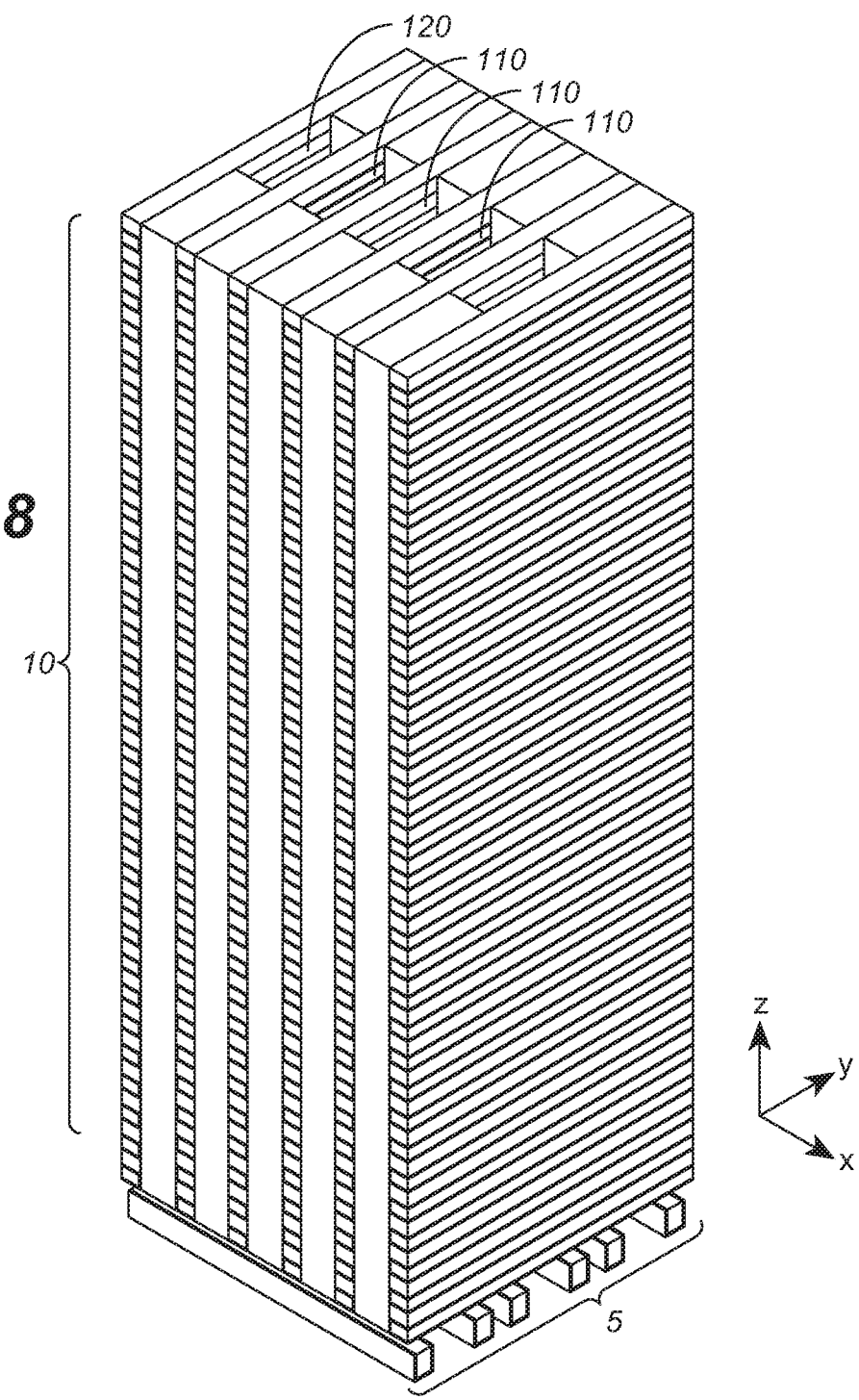
FIG. 8 shows patterning and etching of vias 120 in trenches 55 and 80 through memory structure 10.
Figure 9:
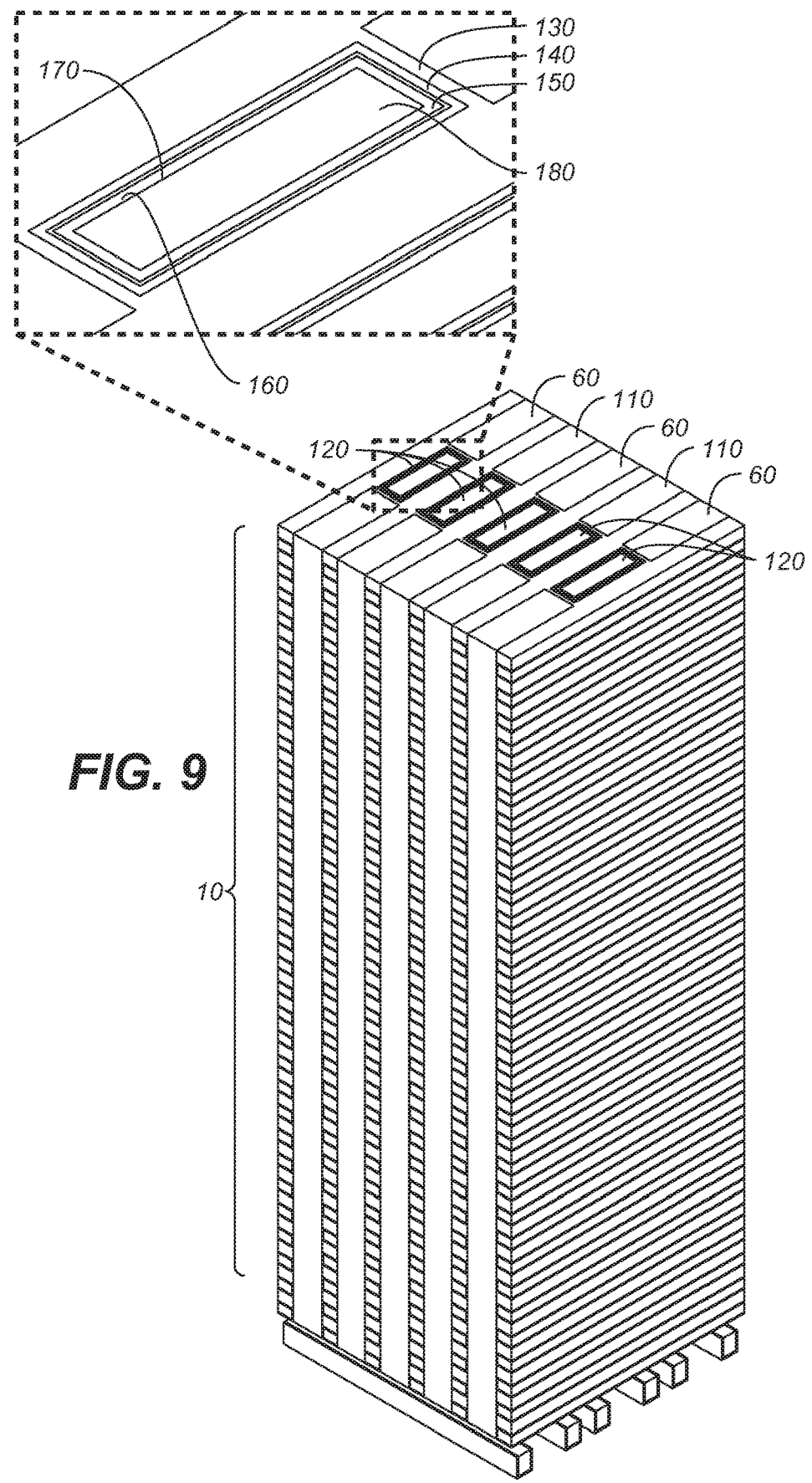
FIG. 9 shows deposition of the following layers conformally in vias 120 of FIG. 8: vias 120: (i) tunneling dielectric layer 130, (ii) charge storage layer 140, (iii) blocking dielectric layer 150, (iv) channel layer 160, (v) liner layer 170, and (vi) sacrificial dielectric layer 180.

FIG. 7 shows sacrificial dielectric layer 110 deposited in trenches 80, after excess sacrificial dielectric material is removed from the top surfaces of memory structure 10 by any suitable planarization technique, such as CMP. Sacrificial dielectric layers 60 and 110 are then patterned using photolithography and etched to provide elongated vias 120 that extend through the height of memory structure 10 (i.e., along the Z-direction), exposing the sidewalls of word line stacks 90, as shown in FIG. 8. Adjacent ones of vias 120 in each trench is separated by a predetermined distance, such as the length along the Y-direction of each via 120.

The following films are then successively deposited conformally in elongated vias 120: (i) tunneling dielectric layer 130, (ii) charge storage layer 140, (iii) blocking dielectric layer 150, (iv) channel layer 160, (v) and optional liner layer 170, and (vi) sacrificial dielectric layer 180. These layers may be deposited using any suitable technique, e.g., as LPCVD, CVD, ALD, PVD, or evaporation, most preferably LPCVD and ALD. Tunneling dielectric layer 130 may be any suitable material for which charge carriers may tunnel through (e.g., silicon dioxide). Tunneling dielectric layer 130 may be any suitable thickness (e.g., 0.5 to 10.0 nm). Charge storage layer 140 may be any suitable material, such as: (i) SiN or silicon rich SiN, in any suitable form (e.g., amorphous, nanocrystalline or polycrystalline), or (ii) germanium nanocrystals in a silicon nitride, silicon oxide matrix, silicon oxide, or silicon-rich silicon oxide. Charge storage layer 140 may be any suitable thickness (e.g., 0.5 to 20 nm). Blocking dielectric layer 150 may be silicon oxide, silicon nitride, silicon oxide nitride, aluminum oxide, or hafnium oxide, or any suitable combination of these materials. Blocking dielectric layer 150 may be any suitable thickness sufficient to block charge carriers from passing through (e.g., 3 to 30 nm).

Channel layer 160 is a suitable n-type or p-type semiconductor material (e.g., silicon, silicon germanium, or indium gallium zinc oxide (IGZO), or zinc oxide) with a suitable thickness (e.g., 2 to 30 nm) and typically in-situ relatively lightly doped or undoped. Sacrificial dielectric layer 180 may include any suitable material, such as $SiO_2$, porous $SiO_2$, boron-doped $SiO_2$ (BSG), phosphorus-doped $SiO_2$ (PSG), boron-phosphorus-doped $SiO_2$ (BPSG), SiOH, SiCOH, or any combination of these materials. Optional liner layer 170 is a material suitable for serving as as etch-stop for a yet to be performed etch of sacrificial dielectric layer 180 (e.g., aluminum oxide or silicon nitride) with any suitable thickness (e.g., 0.5 to 5 nm). After deposition of these layers conformally into vias 120, excess material may be removed from the top of memory structure 10, followed by planarization using any suitable technique, such as CMP.

Figure 10:
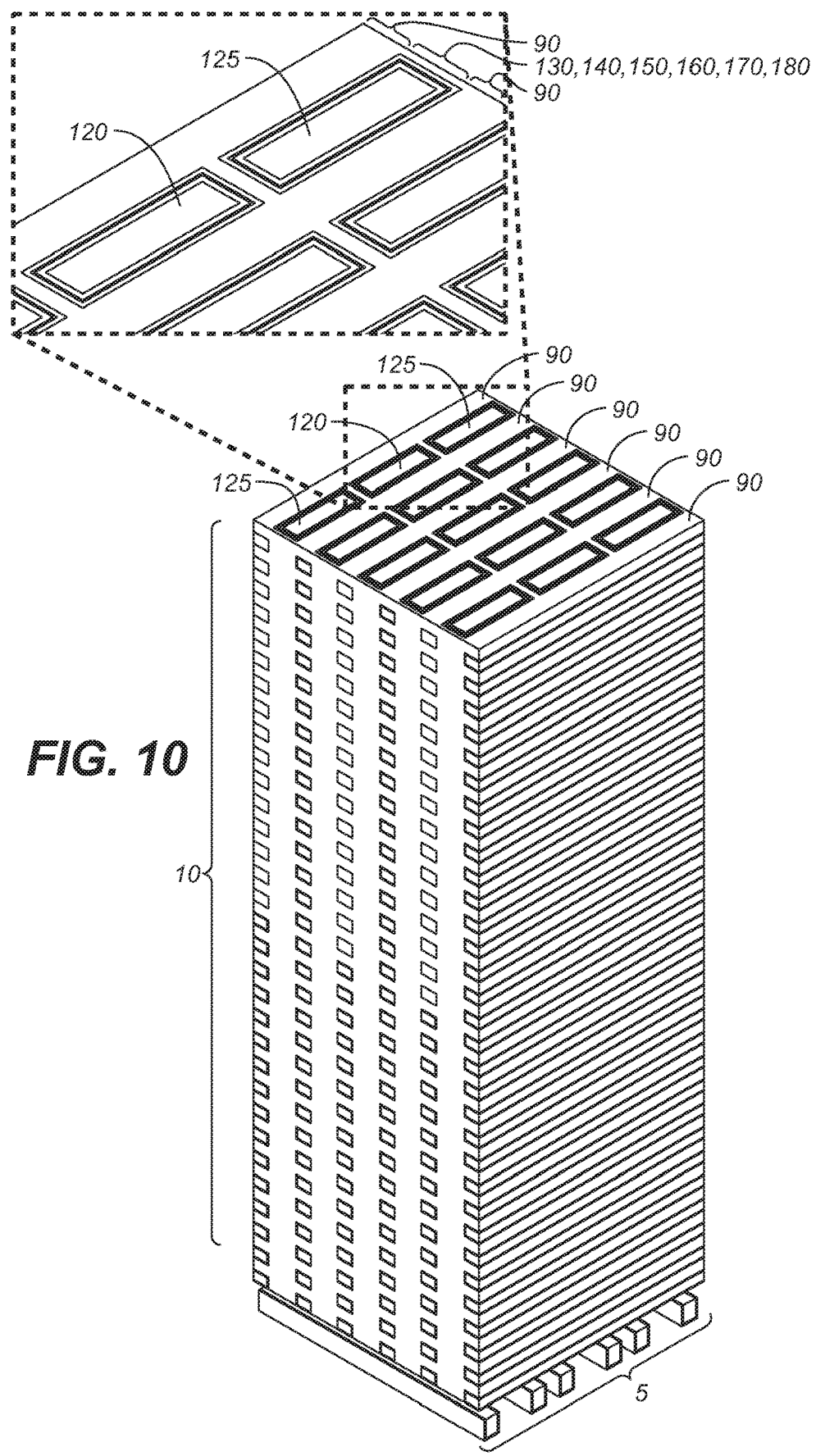
FIG. 10 shows the resulting memory structure 10 after the steps of creating vias of FIG. 8 and the deposition of various layers of FIG. 9 are repeated.

Thereafter, the steps of creating vias of FIG. 8 is repeated to create vias 125 by removing the remaining portions of sacrificial dielectric layers 60 and 110 of trenches 55 and 80, while protecting the deposited layers in vias 120. The same materials are then deposited conformally in vias 125 as in vias 120: (i) tunneling dielectric layer 130, (ii) charge storage layer 140, (iii) blocking dielectric layer 150, (iv) channel layer 160, (v) optional liner layer 170, and (vi) sacrificial dielectric layer 180. The resulting structure is shown in FIG. 10. In FIG. 10, the dielectric material in trenches 55 and 80 are now replaced by adjacent columns of successively deposited layers between word line stacks 90. The charge storage material in this second set of shafts may have different characteristics, if desired, than those of the charge storage material in the earlier set of shafts.

Figure 11:
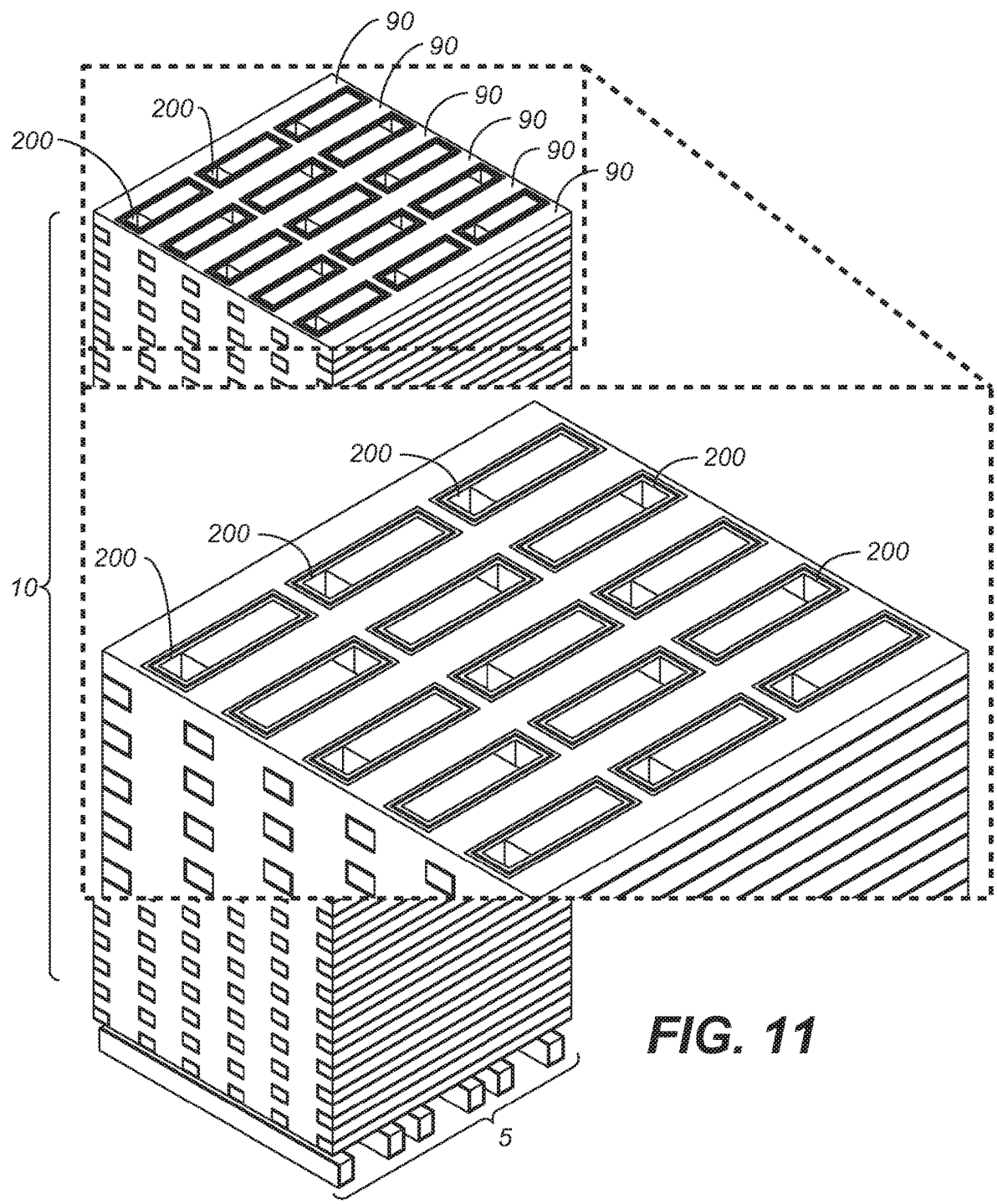
FIG. 11 shows shafts 200 defined in sacrificial dielectric layer 180 using photolithography and etched.

Shafts 200 are then defined in sacrificial dielectric layer 180 using photolithography and etched, as shown in FIG. 11. Each of shafts 200 extends from the top of memory structure 10 down to global interconnect lines 5 through openings in the isolation layer between memory structure 10 and global interconnect lines 5. During etching of shafts 200, which may be a high-power dry etch of sacrificial dielectric layer 180, the sidewalls of channel layer 160 are protected by liner layer 170, which is resistant to the etch. As shown in FIG. 11, adjacent shafts along the X-direction are aligned to each other, however alternatively they can be staggered relative to each other. Only every other adjacent shafts of shafts 200 along the X-direction are exposed to the same conductor in underlying global interconnect lines 5. The portion of liner layer 170 exposed in each of shafts 200 is then removed, for example, by a wet etch which does not damage underlying channel layer 160.

Figure 13:
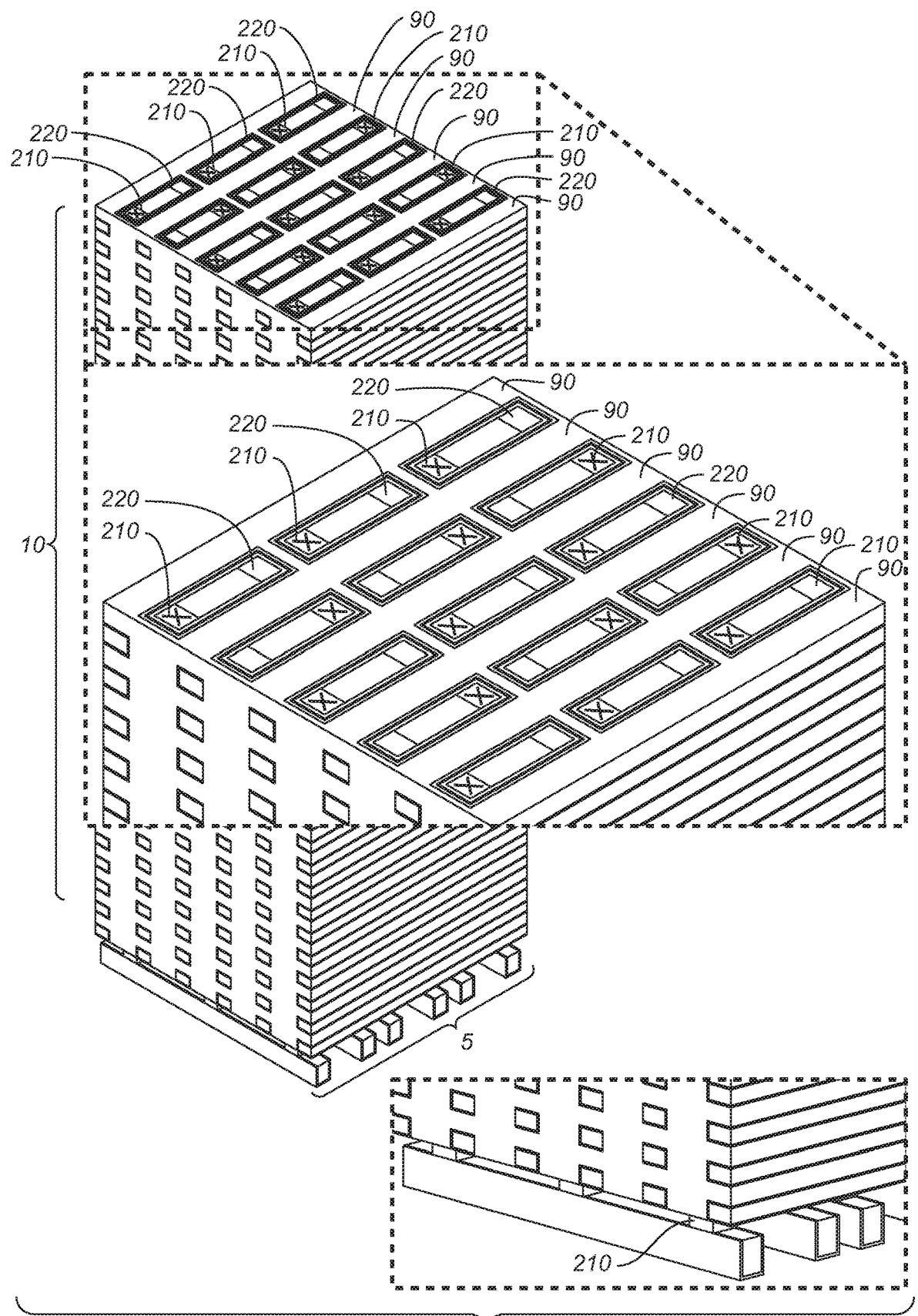
FIG. 13 shows drain semiconductor layers 220 being provided by repeating the steps of defining vias, etching liner layer 170 and filling vias with a semiconductor layer of FIGS. 11-12.

Each of shafts 200 is then filled with semiconductor material 210, which form a common source region for the thin-film transistors to be formed along that via. Source semiconductor layer 210 may be any suitable heavily n-doped or p-doped material, such as silicon, germanium, or silicon germanium. Alternatively the shafts are only partially filled along their walls with the deposited source material, the remaining space in the cavity is then filled with a low-resistivity material such as TiN or Tungsten (not shown). Any portion of semiconductor layer 210 covering the top of memory structure 10 may be removed using a planarisation technique. such as CMP. The resulting structure is shown in FIG. 13. Source semiconductor layer 210 is electrically connected to the global interconnect lines 5.

Figure 12:
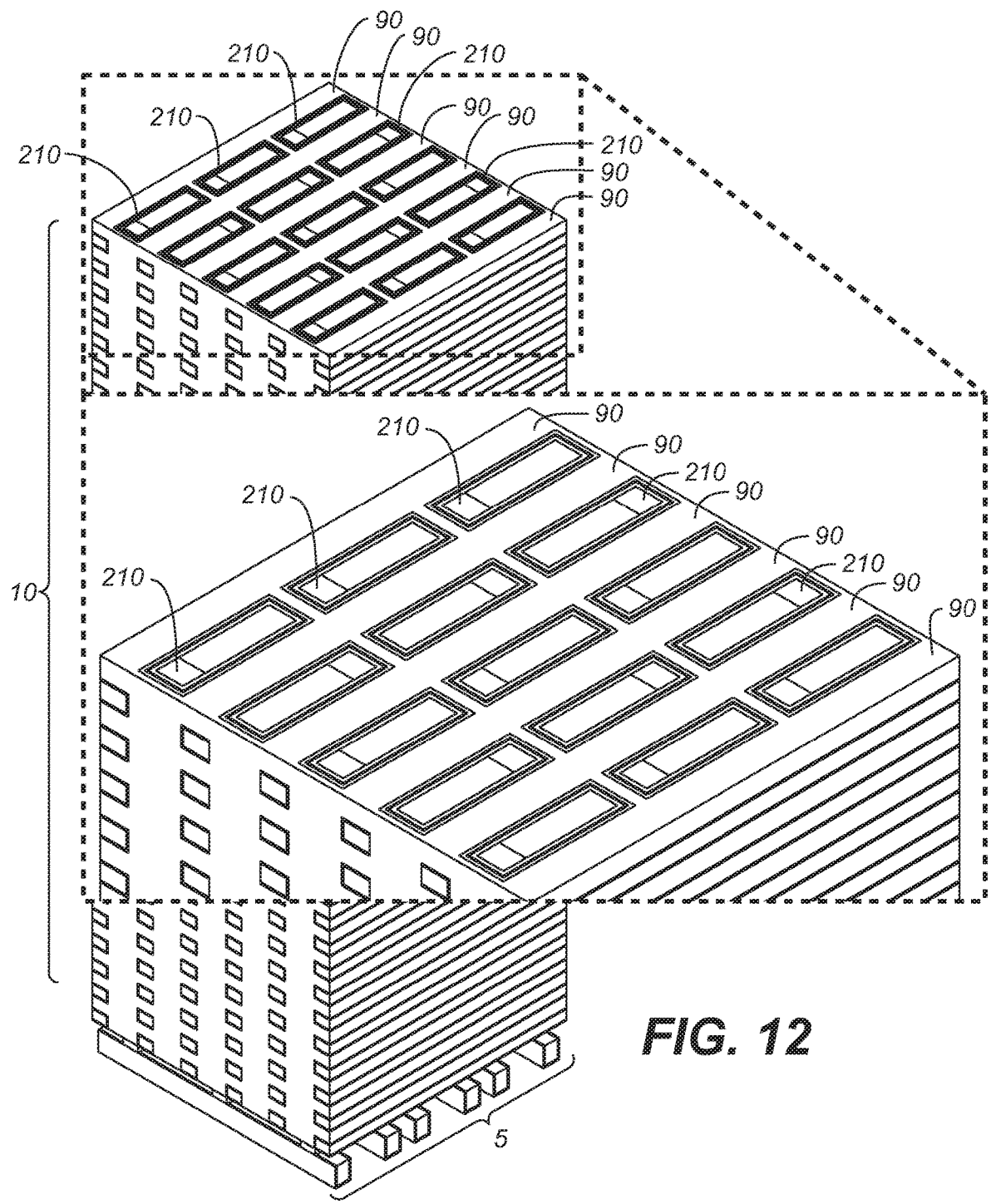
FIG. 12 shows each of shafts 200 being filled with semiconductor material 210, which form a common source region for the thin-film transistors to be formed along that via.
Figure 14:
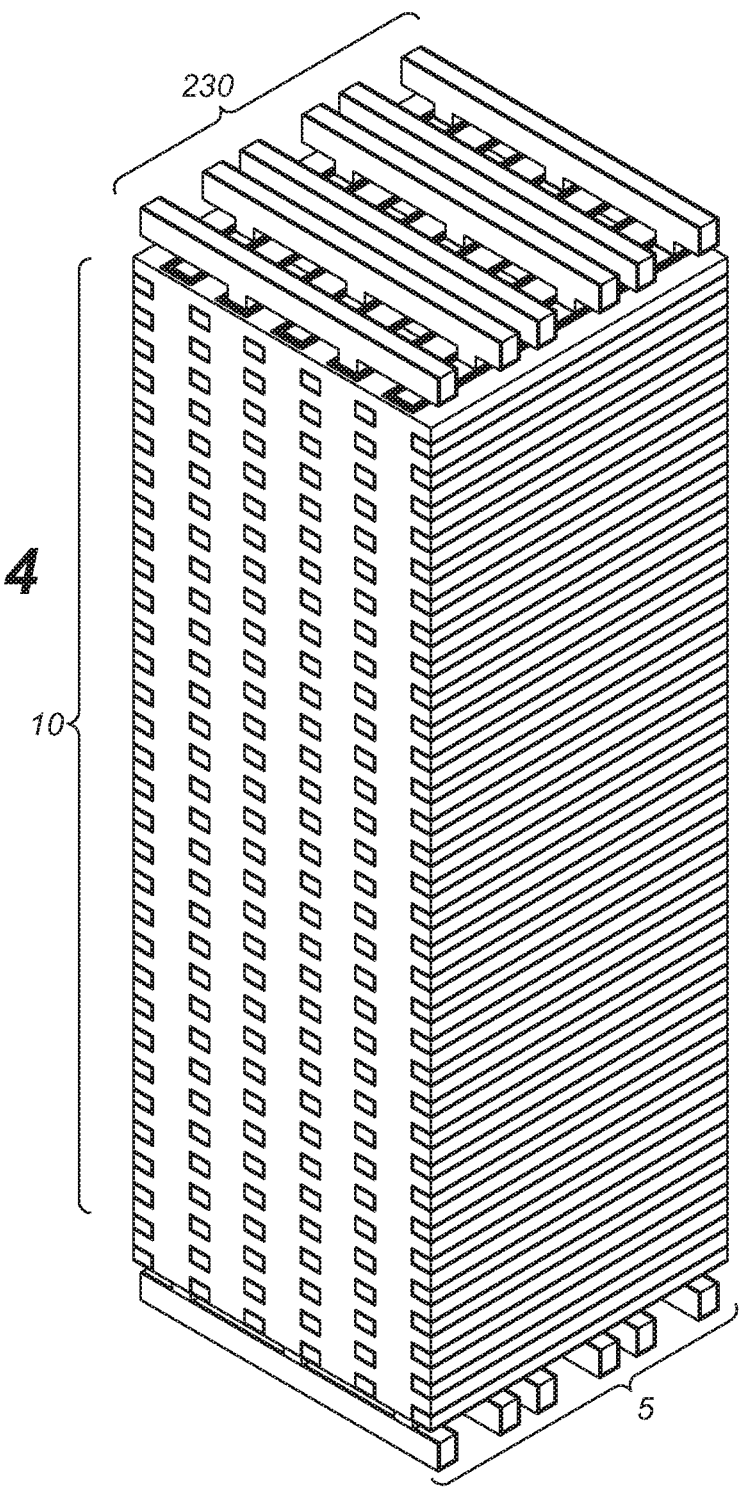
FIG. 14 shows a second set of global interconnect lines 230 provided above memory structure 10 for contacting drain semicoductor layers 220.

Drain semiconductor layers 220 are provided by repeating the steps of defining and etching vias in sacrificial dielectric layer 180, etching liner layer 170 and filling vias with a heavily n-doped or p-doped semiconductor layer 210 of FIGS. 11-12, except that etching of vias for drain semiconductor layer 220 does not punch-through to global interconnect lines 5, so that drain semiconductor layer 220 does not contact global interconnect lines 5. The resulting structure is shown in FIG. 13. Source semiconductor layers 210 are marked by an "X" in FIG. 13. A second set of global interconnect lines, labeled global interconnect lines 230 above memory structure 10 for contacting local drain semicoductor layers 220, as shown in FIG. 14, forming global bit lines that connect every other adjacent shaft 220, either directly or through selection transistors, to circuitry in the substrate. At this point, source semiconductor region 210 and drain semiconductor layer 220 of each of shafts 200 form the common source region and the common drain regions ("bit lines") of thin-film storage transistors of a vertical NOR-type (VNOR) memory string, each thin-film transistor being formed at the lateral overlapping region between a word line strip 100 and channel layer 160, tunnel dielectric layer 130, charge storage layer 140 and blocking dielectric layer 150. In one embodiment, each word line strip 100 controls NOR-type memory transistors on each of its side edges.

In a VNOR memory array according to the present invention, a typical nominal minimum width $L_1$ of a word line strip is 50 nanometers, while the nominal minimum width of trench 55 or 80 separating adjacent word line stacks may be 80 nanometers, and the height of a word line stack with 32 active layers may exceed 2,000 nanometers (2 microns). The aspect ratio of a stand-alone word line stack of 50 nanometer width would therefore be 2000/50, or 40:1, which would be severely challenging to remain standing erect during an etch, let alone through successive process steps, which would adversely impact yields and cost. However, using a method according to the present invention, the width $L_2$ of each masking structures 50 and 70 of FIGS. 1 and 3 is 50+80+50=180 nanometers, therefore the aspect ratio of an etch using masking structures 50 or 70 is 2,000/180, or 11:1.

In some embodiments, for die size considerations, it may be advantageous to place some circuitry (e.g., decoding circuits, and some read, write and erase supply voltage sources) that is electrically connected through global interconnect lines 5 or global interconnect lines 230 in a part of the semiconductor substrate that is directly underneath memory structure 10. (These decoding circuits and voltage sources are not shown in FIG. 14.) Electrical connections between global interconnect lines 5 and these circuits in the semiconductor substrate are readily available. To electrically connect these circuits in the semiconductor substrate to global interconnect line 230 above memory structure 10 may require providing additional vertical connectors on one or more sides of memory structure 10 as well as conductors positioned between global interconnect lines 230 and the circuits in the semiconductor substrate. In one embodiment, such circuitous paths may be avoided by providing vertical conductors connecting global word lines 220 to the circuits in the semiconductor substrate directly through the densely packed memory structure 10 and the densely spaced global interconnect lines 5. These vertical conductors may be implemented by having selected ones of local vertical source semiconductor layer 210 or local vertical drain semiconductor layer 220 to also serve as conductors for connecting to the circuits in the semiconductor substrate. When used in that manner, one option is to fill the vias with a more conductive material (such as metal) instead of a heavily doped semiconductor. To establish electrical paths using these vertical conductors may require an extra mask and an etch step to punch-through via openings at the bottom of their respective shafts at locations directly above or close to where such circuits are placed in the semiconductor substrate.

In some embodiments, global interconnect lines 5 underneath memory structure 10 need not be formed when vertical local source semiconductor layer 210 and vertical local drain semiconductor layer 220 are all connected to global interconnect lines 230 formed above memory structure 10. Such an arrangement obviates the punch-through masking and etch steps required to connect source semiconductor layer 210 to global interconnect lines 5. Conversely, semiconductor layer 210 and drain semiconductor layer 220 may all be contacted through the punch-through vias to global interconnect lines 5 at the bottom of memory structure 10. In either case, one of the two sets of global interconnect lines may be obviated, provided that the global interconnect lines have approximately one-half the pitch of global interconnect lines 5 or global interconnect lines 230, which may require double exposures or more advanced lithography.

Figure 15:
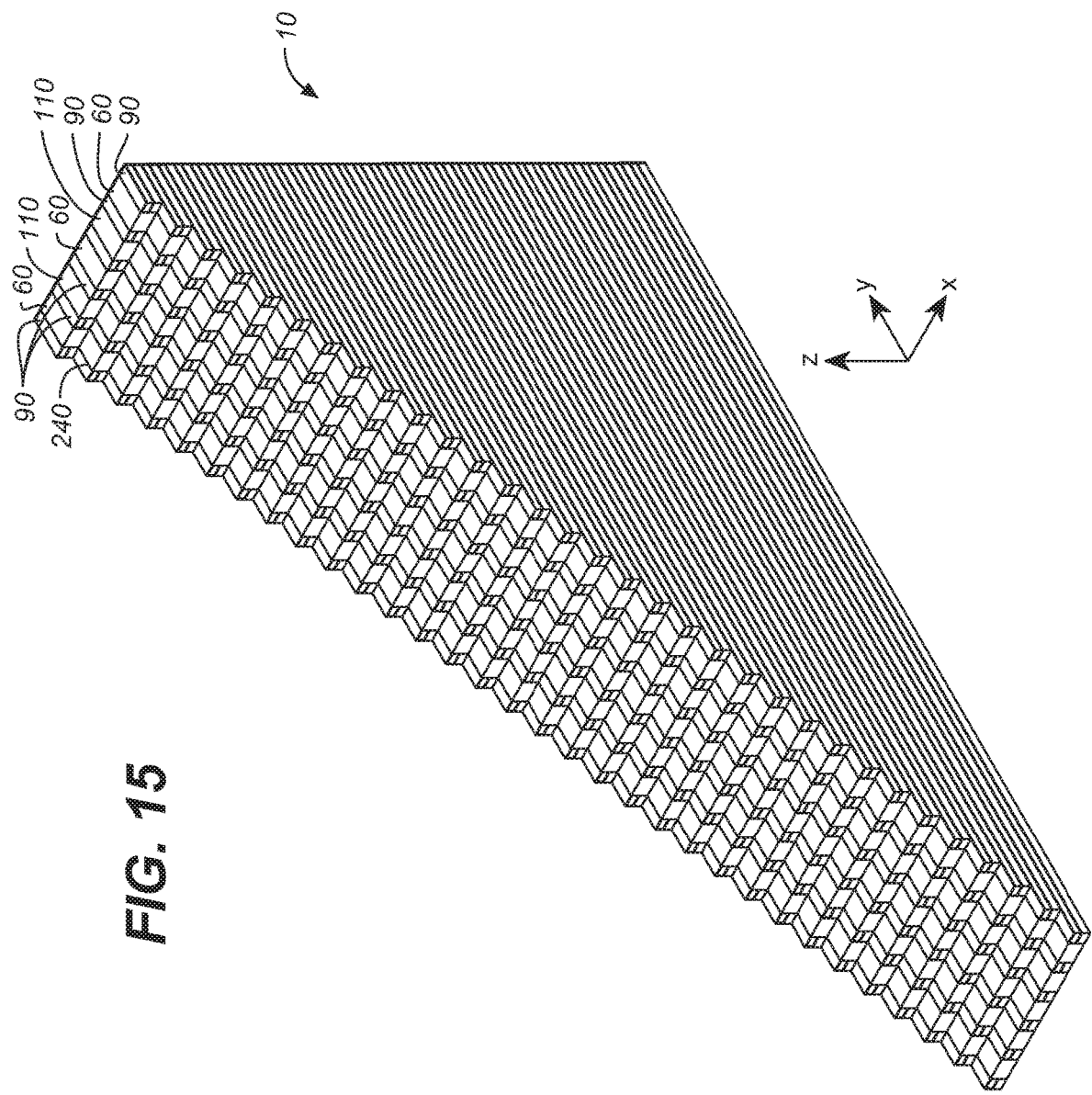
FIG. 15 shows a staircase structure to enable contacting local word lines 240 of memory structure 10.

Connections to the local word lines are made by a "staircase" method. In a staircase structure, the word line strips in a word line stack are cut to successively greater lengths to allow vertical conductors to contact the local word lines of successive word line strips at the steps. A similar method to form staircase structures is disclosed, for example, in Provisional Application IV incorporated by reference above. After memory formation and connection to top and bottom global wordlines, connections to the wordlines are made by a "staircase" method. The staircase structure is made by first providing a masking layer to expose and etch away a portion of the top word line strip in each word line stack exposing metal layer 100 of the word line strip, and successively (i) recessing the masking layer; (ii) etching away a portion of each of the exposed word line strips, exposing a portion of metal layer 100 at each step, until each of word line strips in the word line stack—except the bottom word line strip—has a portion removed as shown in FIG. 15. FIG. 15 shows only an end portion along the length of the word line strips) of memory structure 10. (The portion between the end portions, i.e., the portions containing the thin-film transistors, are the portions shown in FIGS. 1-14.) Using a photoresist recess technique discussed, for example, in Provisional Application IV, a masking layer is recessed along the Y-direction from one or both ends without an additional photo-lithographical step to expose successive word line strips.

Figure 16:
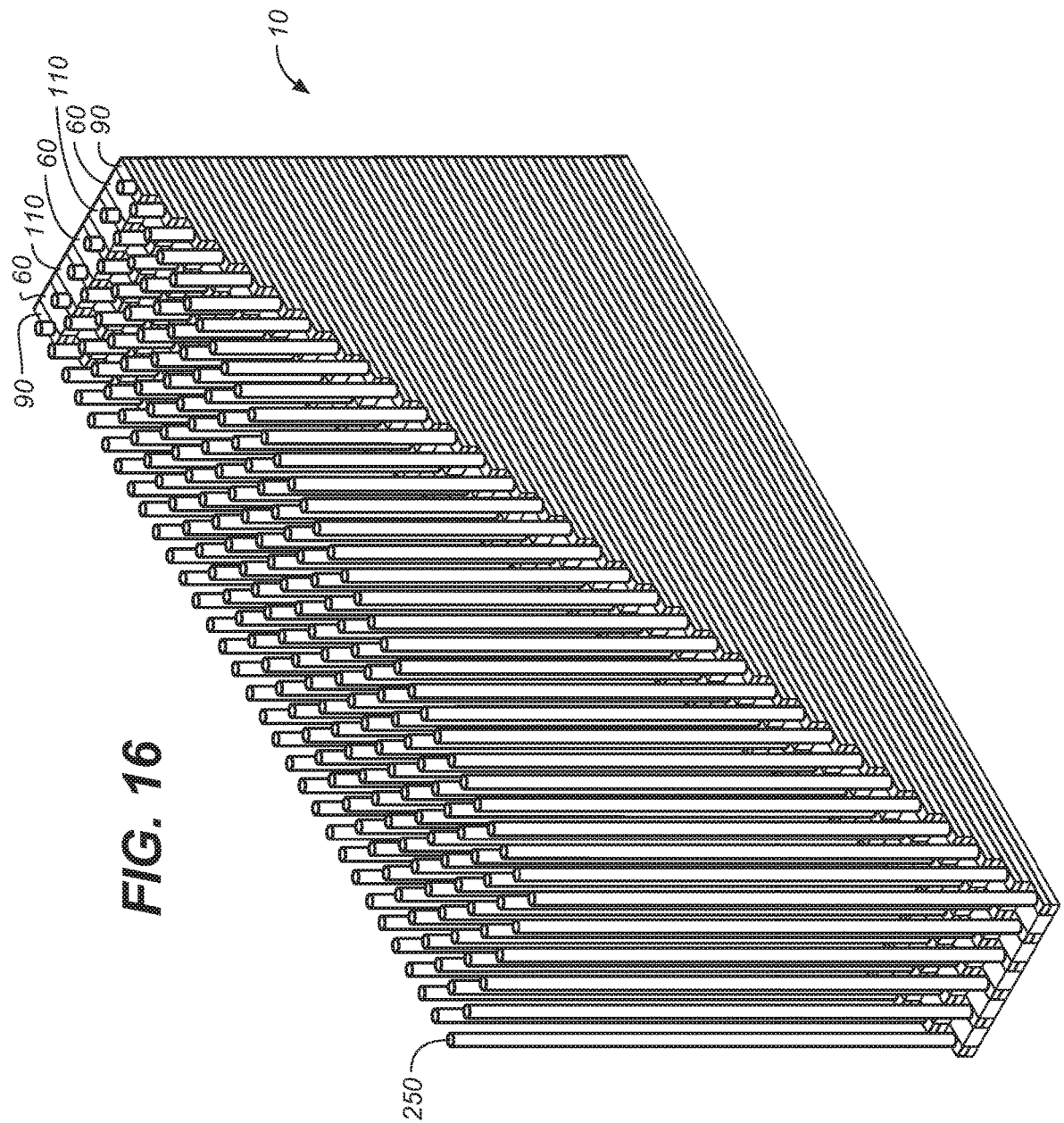
FIG. 16 shows vias and conductors 250 in the staircase structure of FIG. 15 to enable contacting of local word lines 240.

A dielectric material is then deposited over the staircase structure and planarized by CMP. FIG. 16 shows that the result dielectric material is patterned and etched for via openings, which are then and then filled with a conductive material (e.g., a refractory metal, such as tungsten) 250 to provide contacts to the ends of word line layer 240 in each active layer exposed by the staircase structure. In this manner, each word line is connected to selective circuitry (e.g., a decoder and a voltage source) in the semiconductor substrate, or on a separate companion integrated circuit.

Such an integrated circuit may be connected to circuitry in the semiconductor substrate using a flip-wafer technique (e.g., through a multitude of miniature copper studs between connected wafers) known in the art.

Figure 18:
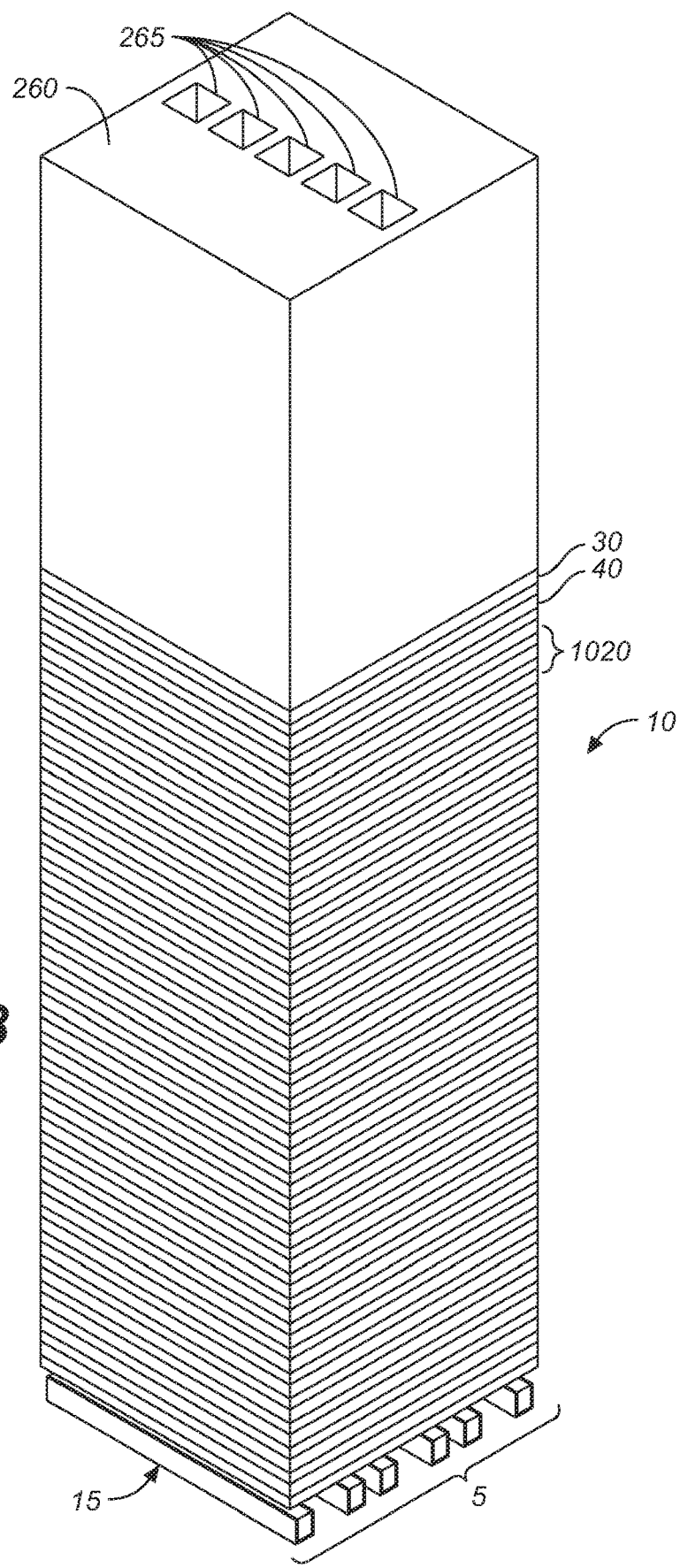
FIGS. 18, 19, 20 and 21, in conjunction with FIGS. 4-16 above, illustrate fabrication of memory structure 10, according to a second embodiment of the present invention.
Figure 19:
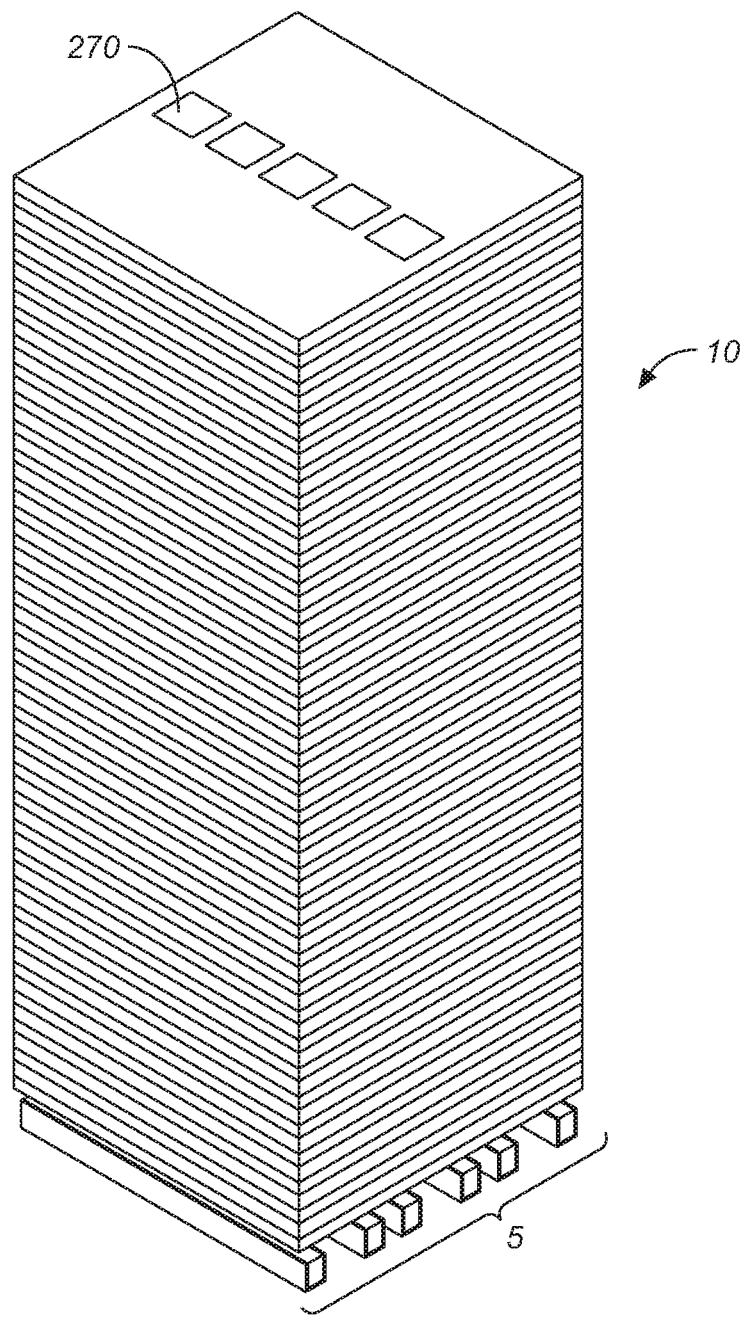

According to another embodiment of the present invention, structural support for high aspect ratio word line strips is provided by dielectric pillars formed prior to word line strip formation. As shown in FIG. 18, memory structure 10—including global interconnect lines are formed, in substantially the same manner as discussed above with respect to FIG. 1. However, unlike mask layer 50 of FIG. 1, mask layer 260 is provided, which is patterned to allow shafts 265 to be etched through the word line stacks. After etching of shafts 265 and removal of mask 260, shafts 265 are filled by s dielectric material to form dielectric pillars 270, with excess dielectric material suitably removed (e.g., by CMP or etch back) from the top of structure 10, as shown in FIG. 19. Suitable dielectric materials for dielectric pillars 270 include any suitable material (e.g., $SiO_2$, SiN, SiON, SiC, SiCOH, PSG, BSG, or BPSG, most preferably $SiO_2$), deposited using any suitable technique (e.g., ALD, LPCVD, or PECVD, most preferably LPCVD).

Figure 20:
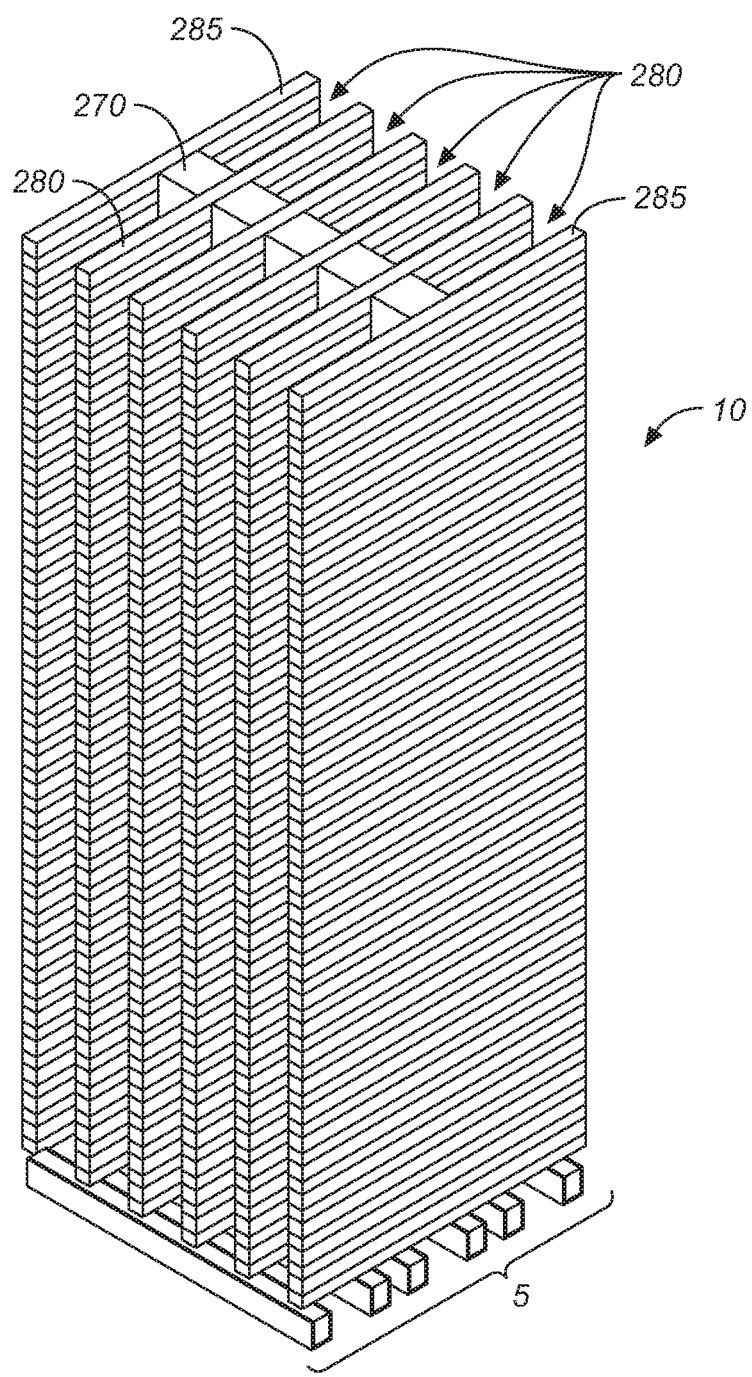
Figure 21:
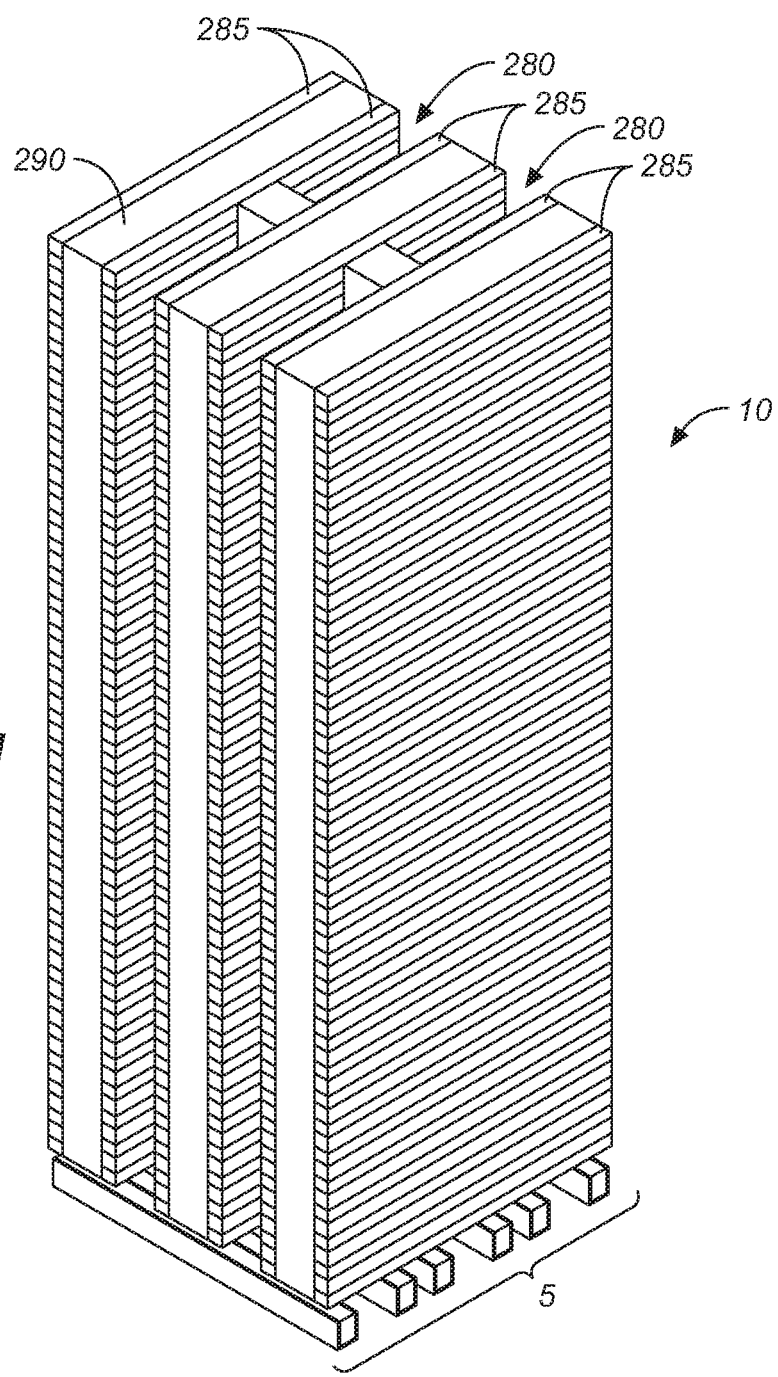
Figure 22:
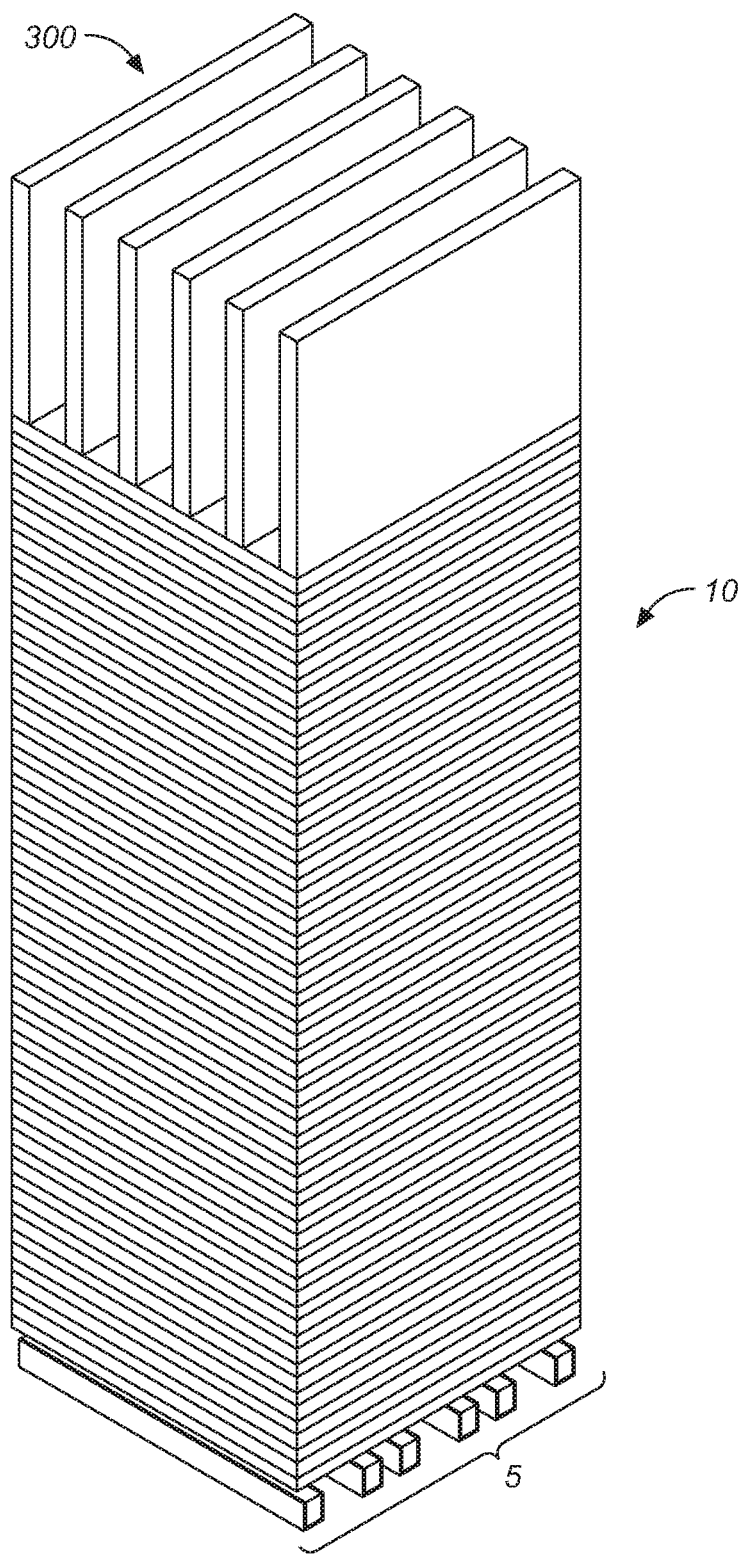
FIGS. 22, 23, 24, 25, 26, 27, 28 and 29, in conjunction with FIGS. 8-16 above, illustrate fabrication of memory structure 10, according to a second embodiment of the present invention.

Memory structure 10 is then patterned to form word lines stacks 285 by creating trenches 280 with mechanical support from dielectric pillars 270, which are not substantially etched. The resulting structure is shown in FIG. 20. The dielectric pillars 270 provide mechanical support to the high aspect-ratio stacks 280 of word line strips. Sacrificial dielectric material 290, which may be the same material as dielectric pillars 270, is deposited to fill trenches 280. Excess sacrificial dielectric material 290 may be removed from the top of word line stacks 285 using, for example, CMP or etchback. Thereafter, a masking layer (not shown) may be deposited and patterned, so as to allow sacrificial dielectric material 290 to be removed from every other ones of the filled trenches 280. Memory structure 10, after removal of the masking layer and sacrificial dielectric material 290 form every other ones of trenches 280, is shown in FIG. 22. The rest of the fabrication of memory structure 10 may proceed according to the description above and FIGS. 4-16.

Figure 23:
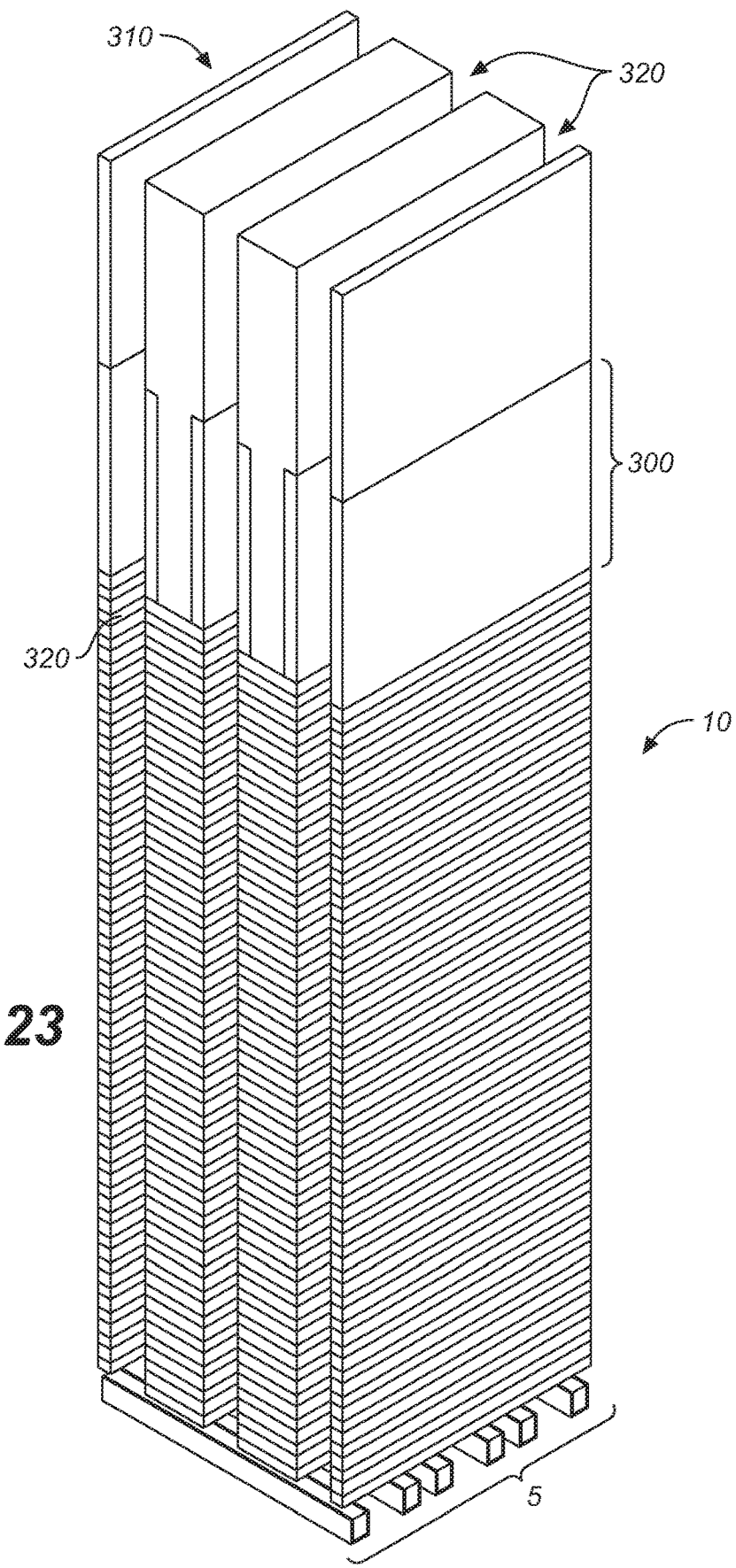

Yet another embodiment of the present invention uses stacked masks to form the word line strips. Referring to FIG. 22, first masking layer 300 is deposited and patterned. First masking layer 300 defines the final dimension and pitches of the word line stacks. After the first masking layer 300 is formed, second masking layers 310, shown in FIG. 23, is deposited and patterned. Second masking layer 310 has a larger pitch and dimension than first masking layer 300, and is provided on top of first masking layer 300. Second masking layer 310 defines every other final word stacks in memory structure 10, as shown in FIG. 23. FIG. 23 also shows trenches 320, which are etched through memory structure 10 after second masking layer 310 is defined.

Figure 24:
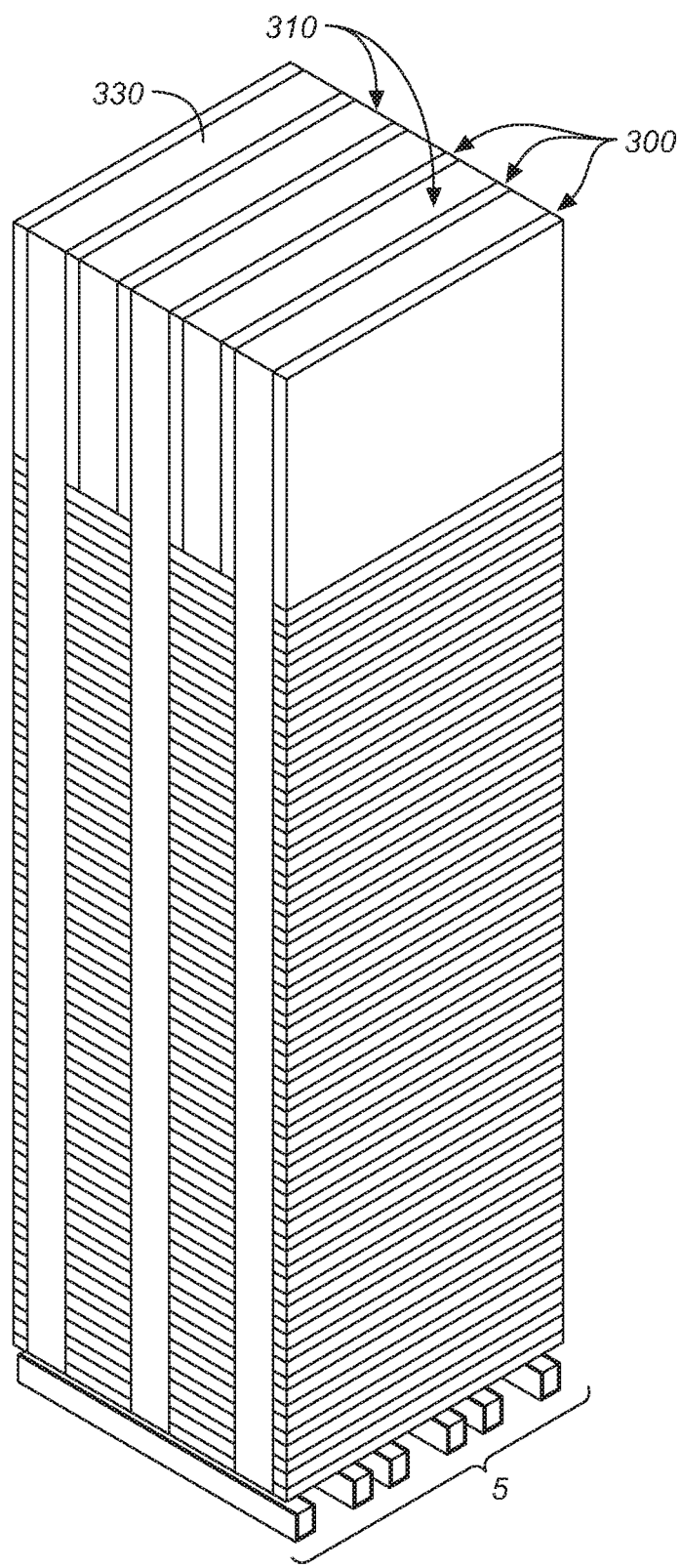

A planarization step (e.g., an etch-back step) removes remove a portion of second masking layer 310, such that the top of second masking layer 310 is flush with first masking layer 300. Sacrificial dielectric material 330 is then deposited to fill trenches 320, followed by removal of excess sacrificial dielectric material 330 from the top surfaces of first masking layer 300 and second masking layer 310, such as shown in FIG. 24.

Figure 25:
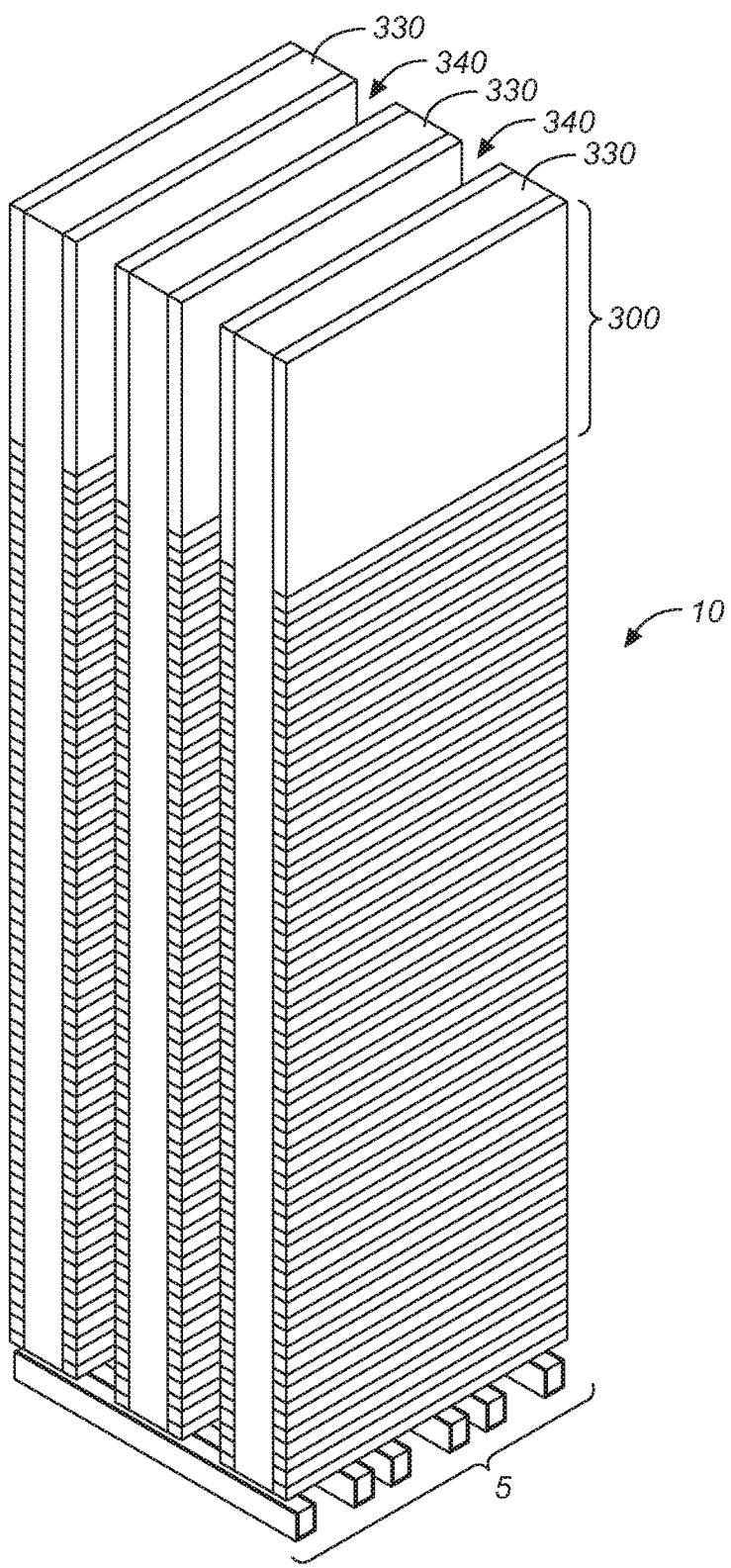
Figure 26:
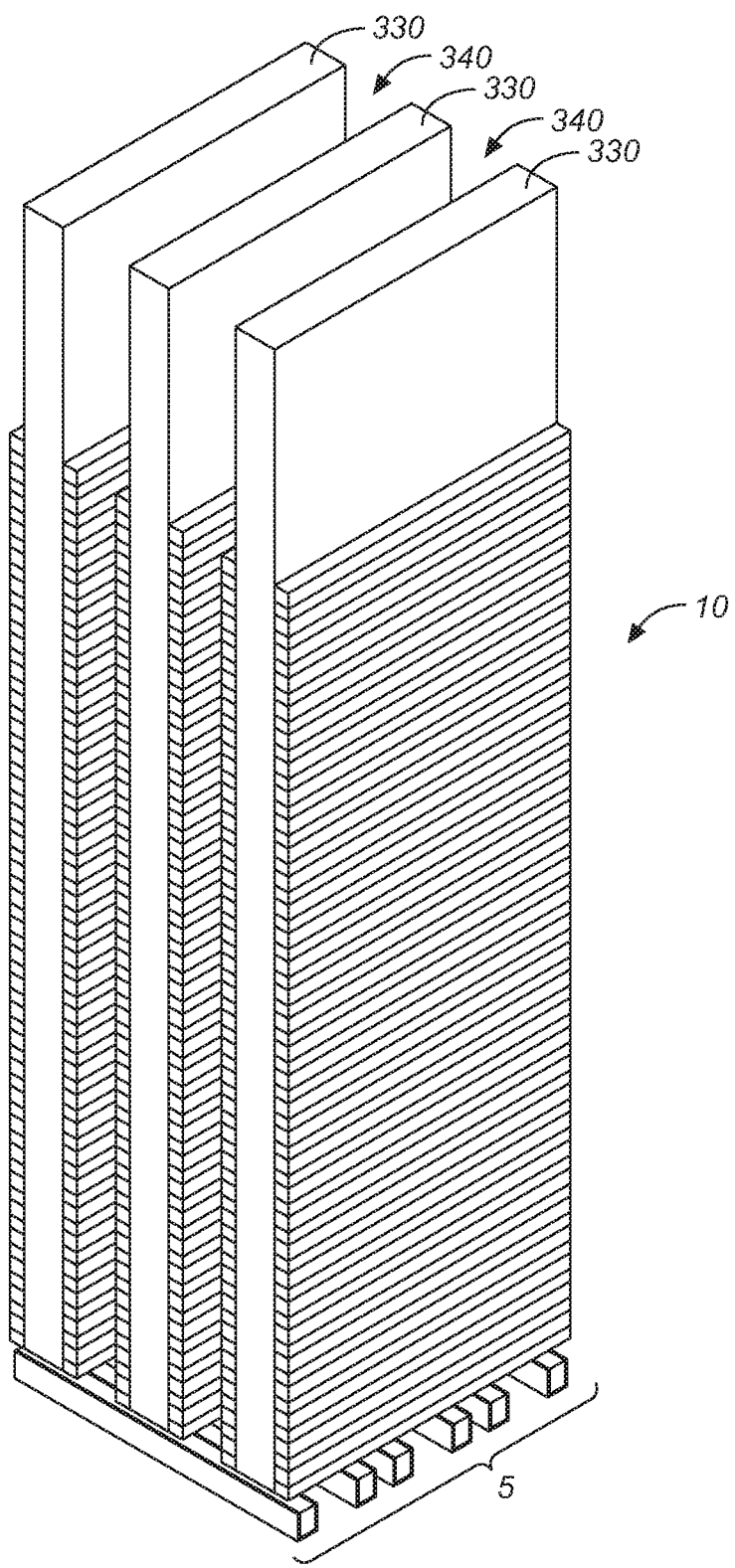

The remainder of second masking layer 310 is then removed by a selective etching technique. First masking layer 300 and sacrificial dielectric layer 330 are then used as masks to etch a second set of trenches 340, as shown in FIG. 25. Thereafter, the remainder of first masking layer 300 is then remove by a selective etching technique, as shown in FIG. 26.

Figure 27:
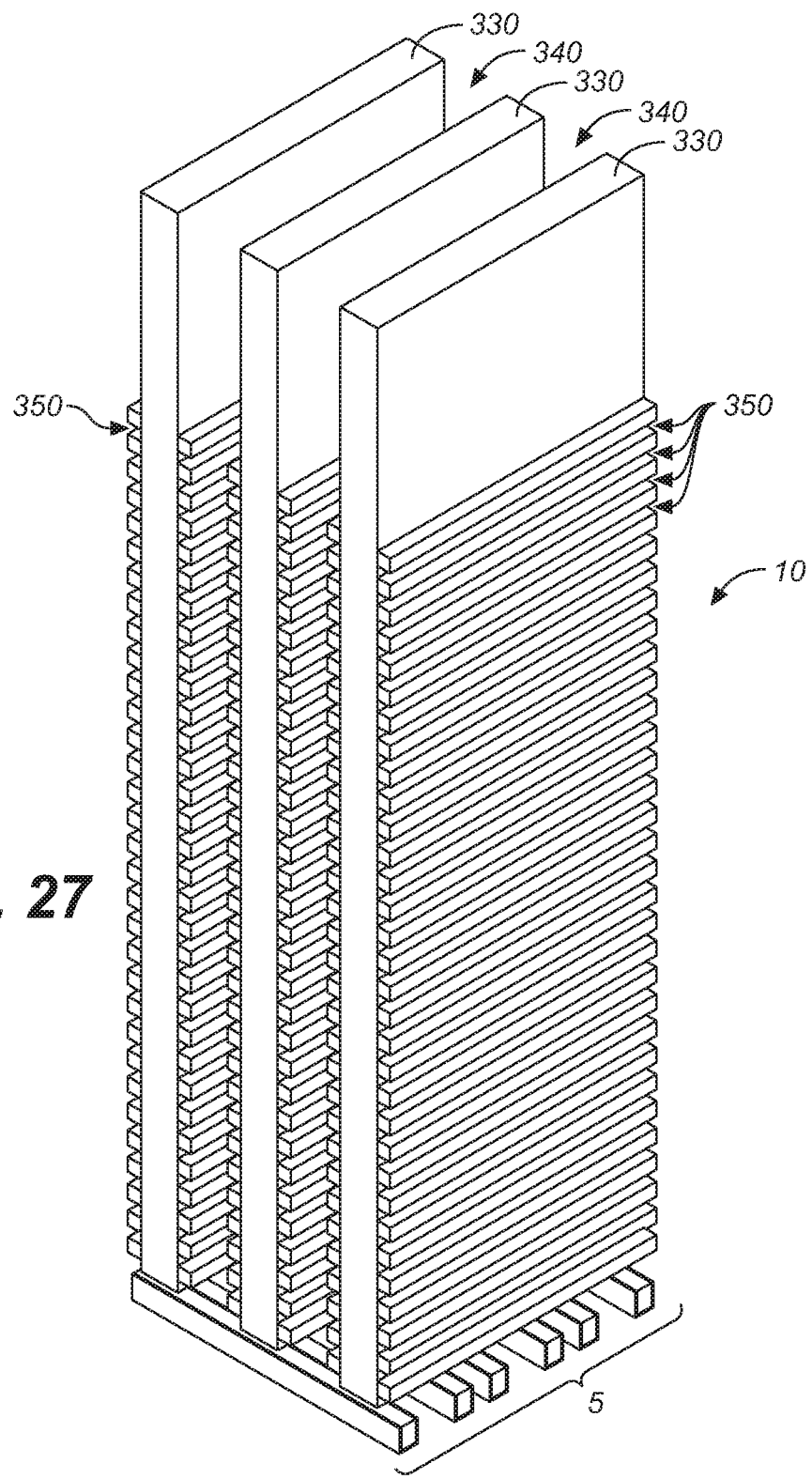
Figure 28:
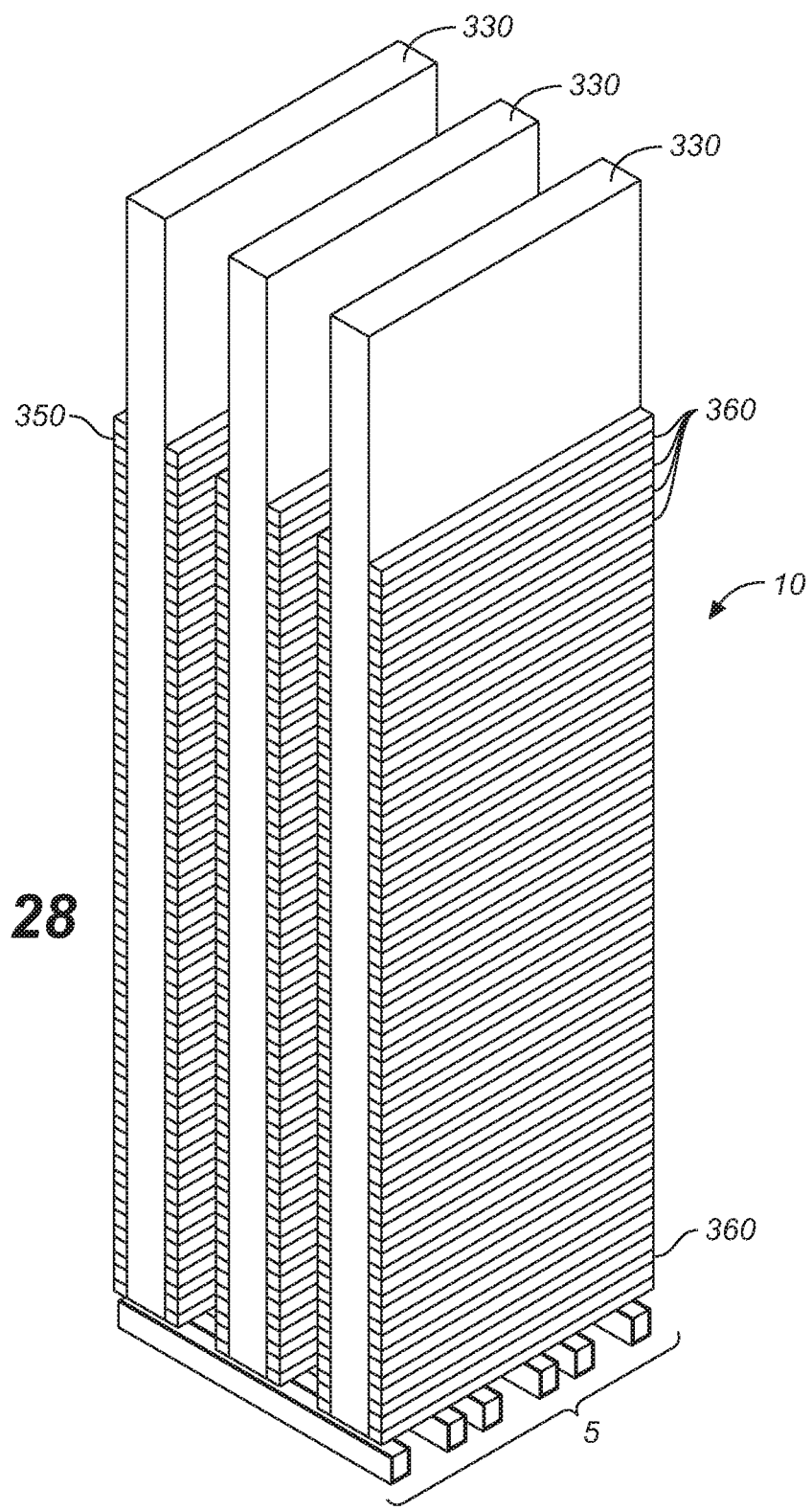
Figure 29:
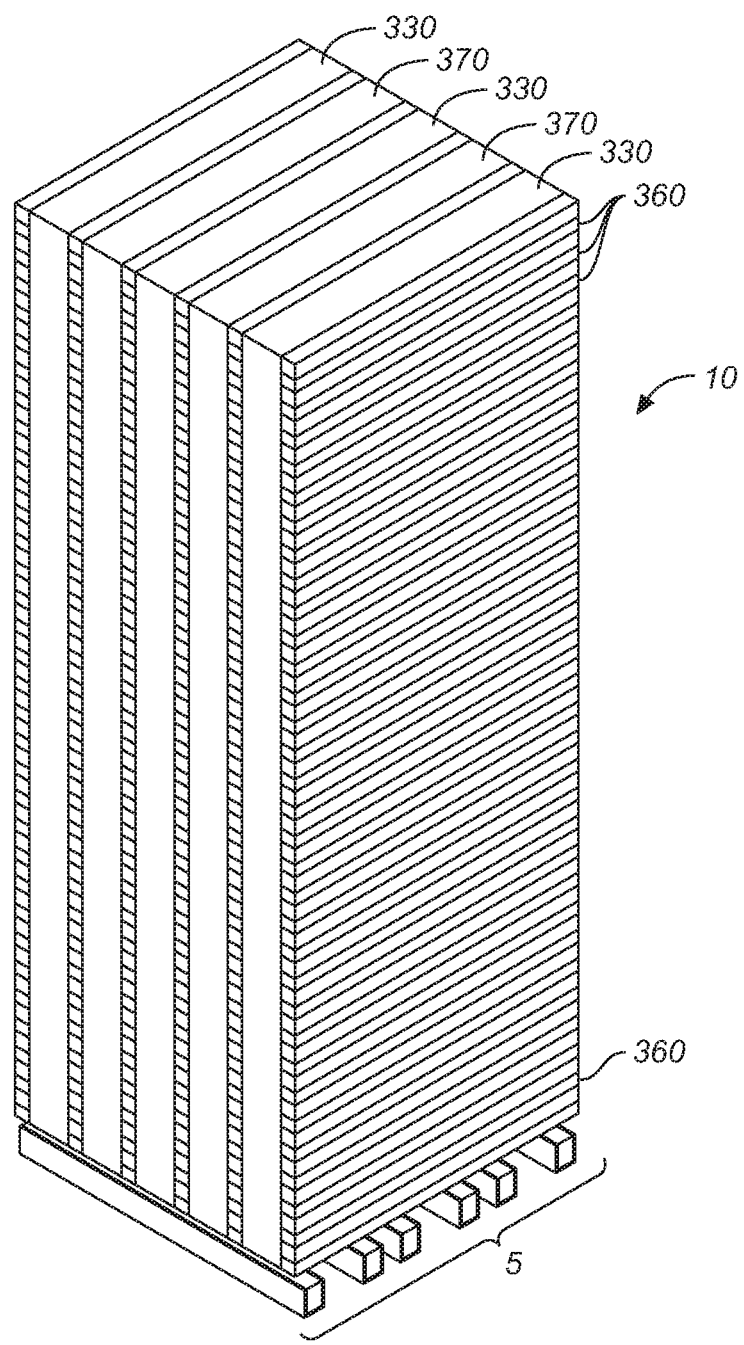

The silicon nitride layers (40) are then removed by a selective etching technique, leaving cavities 350, such as shown in FIG. 27. Metal layers 360 are then deposited to fill trenches 340 and cavities 350. Metal deposited on the sidewalls of trenches 340 and top surfaces of sacrificial dielectric material 330 are then removed by an isotropic etching technique, leaving metal 360 filling cavities 350, as shown in FIG. 28. The details of this metal replacement process have been detailed in description above in conjunction with FIGS. 4 and 5. Thereafter, sacrificial dielectric material 370 is deposited into trenches 340, followed by removal of any excess sacrificial dielectric material 370 from the top surfaces of memory structure 10. The rest of the fabrication of memory structure 10 may proceed according to the description above and FIGS. 8-16.

The above detailed description is provided to illustrate specific embodiments of the present invention and is not intended to be limiting. Numerous variations and modifications within the scope of the present invention are possible. The present invention is set forth in the accompanying claims.

We claim:

1. A method for high aspect-ratio etching, comprising:
preparing above a surface of a semiconductor substrate a plurality of material multi-layers, stacked one on top of another, along a first direction substantially orthogonal to the surface of the semiconductor substrate, wherein each material multi-layer comprising a first layer of a first dielectric material and a second layer of a first material;
providing a first masking layers that exposes a surface of the material multi-layers to allow a plurality of trenches to be etched in the material multi-layers along the first direction to the substrate; providing a second masking layer on top of the first mask layer, the second masking layer reaching into the first masking layer to protect a portion of the exposed surface of the material multi-layers, such that the combined first and second masking layers allow etching of only every other ones of the trenches; etching the every other ones of the trenches and filling these trenches with a second dielectric material;
removing the second masking layer so as to allow etching of the remainder of the trenches;
etching the remainder of the trenches;
replacing the first material with a conductive material; and
filling the remainder of the trenches with the second dielectric material.

2. The method of claim 1, wherein etching the trenches in the material multi-layer involve an etch of an aspect ratio less than 40.

3. The method of claim 1, further comprising creating a staircase structure at f one end of the multi-layers, wherein the staircase structure has steps that successively extends each multi-layer along the second direction and wherein each step exposes a conductive layer in the multi-layer.

4. The method of claim 3, further comprising providing an electrically insulating material over the staircase structure and providing via connections along the first direction to electrically connect to the conductive layer in each of the steps of the staircase structure.

5. A method for high aspect-ratio etching, comprising:
preparing above a surface of a semiconductor substrate a plurality of material multi-layers, stacked one on top of another, along a first direction substantially orthogonal to the surface of the semiconductor substrate, wherein each material multi-layer comprising a first layer of a first dielectric material and a second layer of a first material;

providing a first masking layers that exposes a surface of the material multi-layers to allow a plurality of trenches to be etched in the material multi-layers along the first direction to the substrate; providing a second masking layer on top of the first mask layer, the second masking layer reaching into the first masking layer to protect a portion of the exposed surface of the material multi-layers, such that the combined first and second masking layers allow etching of only every other ones of the trenches; etching the every other ones of the trenches and filling these trenches with a second dielectric material;

removing the second masking layer so as to allow etching of the remainder of the trenches and etching the remainder of the trenches;

filling the remainder of the trenches with the second dielectric material;

selectively etching first portions of the filled trenches to provide a first plurality of shafts that extends along the first direction; depositing a charge storage material conformally in each of the first plurality of shafts;

depositing a semiconductor layer of a first conductivity conformally over the charge storage material; and filling each of the first plurality of shafts with a third dielectric material.

6. The method of claim 5, further comprising: selectively etching a first via and a second via through the third dielectric material in each shaft; and filling the first and second vias in each shaft by a second semiconductor material of a second conductivity opposite the first conductivity.

7. The method of claim 6, wherein the first and second vias are partially filled with the second semiconductor material, and wherein the first and second vias are subsequently filled by a low resistivity conductor material.

8. The method of claim 6, further comprising:

selectively etching second portions of the filled trenches to provide a second plurality of shafts that extends along the first direction;

depositing a charge storage material conformally in each of the second plurality of shafts; depositing a semiconductor layer of the first conductivity conformally over the charge storage material in each of the second plurality of shafts; and filling each of the third plurality of shafts with the second dielectric material.

9. The method of claim 8, wherein the charge storage material in the third plurality of shafts has different characteristics than those of the charge storage material in the second plurality of shafts.

10. The method of claim 5, further comprising, prior to filling each of the second plurality of shafts with the third dielectric material, depositing a liner layer over the first semiconductor layer, and wherein the method further comprises, prior to filling the first and second vias in each of the second plurality of shafts by the second semiconductor material, removing the liner layer to expose the first semiconductor layer.

11. The method of claim 5, further comprising, prior to preparing the material multi-layers, providing a plurality of conductors above the surface of the semiconductor substrate, each conductor extending along a third direction substantially orthogonal to each of the first and second directions.

12. The method of claim 11, wherein the conductors are isolated from the material multi-layers by an isolation layer, wherein etching the first and second vias in each shaft further comprises etching through the isolation layer to enable providing a conductive path between the conductive material in selected ones of first and second vias and to be electrically connected to corresponding ones of the conductors.

13. The method of claim 5, further comprising providing a plurality of conductors above multi-layer stacks, each conductor extending along a third direction substantially orthogonal to each of the first and second directions.

14. The method of claim 13, further comprising providing conductive paths to enable the second semiconductor materials in selected ones of the first and second vias to be electrically connected to one of the conductors.

15. The method of claim 14, further comprising:

providing circuit elements in the semiconductor substrate; and electrically connecting the second semiconductor material in selected ones of the first and second vias to corresponding ones of the circuit elements, each of the circuit elements being situated substantially below its corresponding first and second vias.

16. The method of claim 15, further comprising providing an isolation layer between the circuit elements and the material multi-layers, wherein electrically connecting selected ones of the second semiconductor material in the selected ones of the first and second vias to their corresponding circuit elements comprises creating conductive paths through the isolation layer.

17. The method of claim 5, further comprising creating a staircase structure at f one end of the multi-layers, wherein the staircase structure has steps that successively extends each multi-layer along the second direction and wherein each step exposes a conductive layer in the multi-layer.

18. The method of claim 17, further comprising providing an electrically insulating material over the staircase structure and providing via connections along the first direction to electrically connect to the conductive layer in each of the steps of the staircase structure.

19. The method of claim 5, wherein etching the trenches in the material multi-layer involve an etch of an aspect ratio less than 40.

* * * * *